(12) United States Patent
Dmitriev et al.

(10) Patent No.: US 11,366,383 B2
(45) Date of Patent: Jun. 21, 2022

(54) METHOD AND APPARATUS FOR DETERMINING POSITIONS OF A PLURALITY OF PIXELS TO BE INTRODUCED IN A SUBSTRATE OF A PHOTOLITHOGRAPHIC MASK

(71) Applicant: Carl Zeiss SMS Ltd., D.N. Misgav (IL)

(72) Inventors: Vladimir Dmitriev, Tsurit (IL); Kujan Gorhad, Kfar Kama (IL); Joachim Welte, Darmstadt (DE); Tanya Serzhanyuk, Rishon LeZion (IL)

(73) Assignee: Carl Zeiss SMS Ltd., D.N. Misgav (IL)

( * ) Notice: Subject to any disclaimer, the term of this patent is extended or adjusted under 35 U.S.C. 154(b) by 70 days.

(21) Appl. No.: 16/589,515

(22) Filed: Oct. 1, 2019

(65) Prior Publication Data

US 2020/0124959 A1  Apr. 23, 2020

(30) Foreign Application Priority Data

Oct. 23, 2018 (DE) .......................... 102018218129.2

(51) Int. Cl.
*G03F 7/20* (2006.01)
*G03F 1/72* (2012.01)
(Continued)

(52) U.S. Cl.
CPC .................. *G03F 1/74* (2013.01); *G03F 1/60* (2013.01); *G03F 1/72* (2013.01); *G03F 1/86* (2013.01);
(Continued)

(58) Field of Classification Search
CPC ..... G03F 1/38; G03F 1/42; G03F 1/60; G03F 1/72; G03F 1/74; G03F 1/84; G03F 1/86;
(Continued)

(56) References Cited

U.S. PATENT DOCUMENTS 9,658,527 B2   5/2017  Dmitriev
2005/0188341 A1  8/2005  Fukuhara et al.
(Continued)

FOREIGN PATENT DOCUMENTS

CN    107111236     8/2017  ............... G03F 7/20
DE    102011083774  4/2012  ............... G03F 1/72
(Continued)

OTHER PUBLICATIONS

Cohen et al., "Improving wafer level CD uniformity for logic applications utilizing mask level metrology & process", Photomask Technology, *Proc. of SPIE*, vol. 8880, pp. 888025-1-888025-7 (2013).

(Continued)

*Primary Examiner* — Christina A Riddle
(74) *Attorney, Agent, or Firm* — Fish & Richardson P.C.

(57) ABSTRACT

The present invention refers to a method and an apparatus for determining positions of a plurality of pixels to be introduced into a substrate of a photolithographic mask by use of a laser system, wherein the pixels serve to at least partly correct one or more errors of the photolithographic mask. The method comprises the steps: (a) obtaining error data associated with the one or more errors; (b) obtaining first parameters of an illumination system, the first parameters determining an illumination of the photolithographic mask of the illumination system when processing a wafer by illuminating with the illumination system using the photolithographic mask; and (c) determining the positions of the plurality of pixels based on the error data and the first parameters.

22 Claims, 16 Drawing Sheets

(51) Int. Cl.
*G03F 1/74* (2012.01)
*G03F 1/86* (2012.01)
*G03F 1/60* (2012.01)

(52) U.S. Cl.
CPC ...... *G03F 7/70441* (2013.01); *G03F 7/70466* (2013.01); *G03F 7/70508* (2013.01); *G03F 7/70625* (2013.01)

(58) Field of Classification Search
CPC ............ G03F 7/70441; G03F 7/70466; G03F 7/70625; G03F 7/7055; G03F 7/70608–70683; G03F 7/70025; G03F 7/70075; G03F 7/70091–70116; G03F 7/70125; G03F 7/70133; G03F 7/70208; G03F 7/70283; G03F 7/70483; G03F 7/70491; G03F 7/705–70541; G03F 7/70558; G03F 7/70591; G03F 7/70941; G03F 7/70991; G03F 1/22; G03F 1/24; G03F 1/44; G03F 1/68; G03F 1/70; G03F 1/76; G03F 1/82; G03F 7/20; G03F 7/2002–2006; G03F 7/2053; G03F 7/70383
USPC .......... 430/5, 22, 30; 355/30, 52–55, 67–71, 355/72–77; 716/50–56
See application file for complete search history.

(56) References Cited

U.S. PATENT DOCUMENTS

| | | |
|---|---|---|
| 2007/0162887 A1 | 7/2007 | Suh et al. |
| 2008/0106719 A1 | 5/2008 | Suh et al. |
| 2010/0235805 A1* | 9/2010 | Faivishevsky ............ G03F 1/84 716/50 |
| 2012/0009511 A1* | 1/2012 | Dmitriev ................... G03F 1/72 430/5 |
| 2012/0084044 A1 | 4/2012 | Dmitriev |
| 2013/0295698 A1* | 11/2013 | Pforr ......................... G03F 1/38 438/14 |
| 2014/0036243 A1 | 2/2014 | Beyer et al. |
| 2014/0165236 A1 | 6/2014 | Budach et al. |
| 2017/0176866 A1 | 6/2017 | Dmitriev |
| 2018/0299770 A1 | 10/2018 | Ten Berge et al. |

FOREIGN PATENT DOCUMENTS

| | | | |
|---|---|---|---|
| DE | 102017212848 | 1/2019 | ................ G03F 1/72 |
| KR | 10-0673014 | 1/2007 | ........... H01L 21/027 |
| KR | 10-0809710 | 3/2008 | ........... H01L 21/027 |
| KR | 1020130132907 | 12/2013 | ................ G03F 7/20 |
| KR | 1020170048509 | 5/2017 | ................ G03F 1/72 |
| TW | 200540662 | 12/2005 | ............. G06F 17/50 |
| TW | I560515 | 12/2016 | ................ G03F 1/72 |
| TW | 201800836 | 1/2018 | ................ G03F 1/72 |
| TW | I610127 | 1/2018 | ................ G03F 1/72 |
| WO | WO 2016/042549 | 3/2016 | |
| WO | WO 2019/021154 | 1/2019 | ................ G03F 1/72 |

OTHER PUBLICATIONS

The Taiwan Office Action and Search Report for Taiwan Application No. TW 108133861 dated Mar. 23, 2021 (With English Translation).
The Notice of Reasons for Rejection issued by the Korean Patent Office for Korean Application No. KR 10-2019-0132238, dated Apr. 13, 2021 (With English Translation).
The Notice of Reasons for Rejection issued by the Korean Patent Office for Application No. KR 10-2019-0132238 dated Nov. 12, 2021 (with English Translation).

* cited by examiner

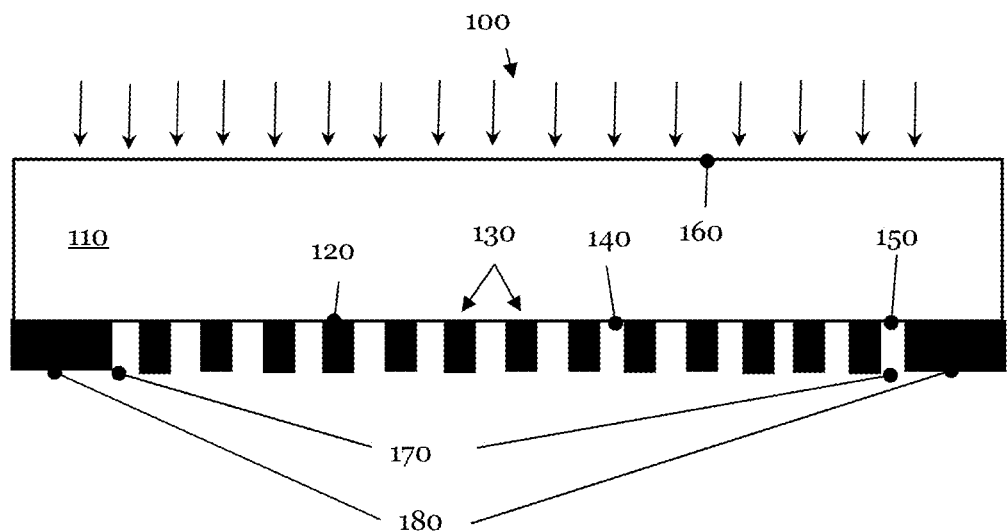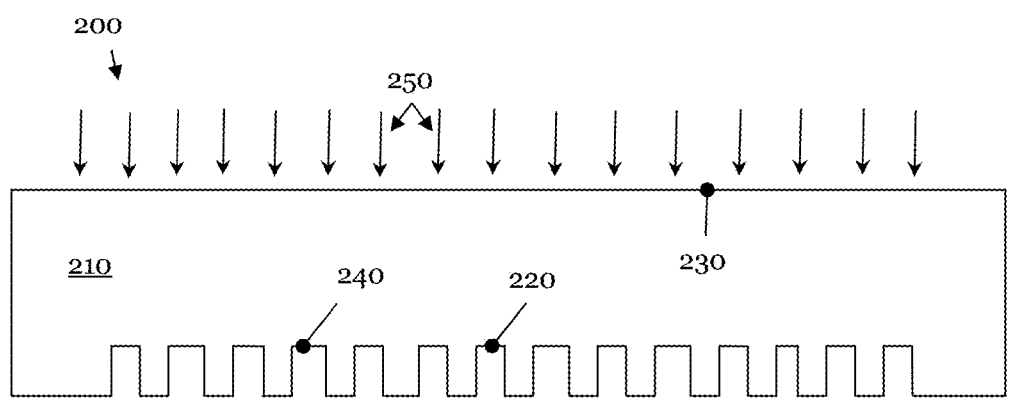

Determined optical attenuation

1700

1800

METHOD AND APPARATUS FOR DETERMINING POSITIONS OF A PLURALITY OF PIXELS TO BE INTRODUCED IN A SUBSTRATE OF A PHOTOLITHOGRAPHIC MASK

CROSS-REFERENCE TO RELATED APPLICATIONS

This patent application claims priority to and benefit of the German patent application DE 10 2018 218 129.2, filed with the German Patent and Trademark Office on Oct. 23, 2018, the entire content of which is incorporated herein by reference.

TECHNICAL FIELD

The present disclosure relates to the field of correcting one or more errors of a photolithographic mask. In particular, the present disclosure refers to a method and an apparatus for determining positions of a plurality of pixels to be introduced in a substrate of a photolithographic mask.

BACKGROUND

As a result of the constantly increasing integration density in the semiconductor industry, photolithographic masks must project smaller and smaller structures onto a photosensitive layer, i.e., a photoresist on wafers. To fulfil this demand, the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. Consequently, the manufacturing of photolithographic masks that fulfil the increasing resolution requirements is becoming more and more complex, and thus more and more expensive as well. It is not unusual that photolithographic masks, photomasks or simply masks have defects at the end of their manufacturing process. Because of the time-consuming mask fabrication process, defects of photomasks should be repaired whenever possible.

For example, for transmissive photolithographic masks, the homogeneity of the optical transmission across the mask area is an important parameter. A variation of the optical transmission across the area of the photolithographic mask leads to a corresponding variation of the local optical intensity dose applied to the photoresist on the wafer when illuminating a wafer through the mask. The variation of the locally applied optical intensity dose or simply dose results in a fluctuation or a variation of the structure dimension of a pattern element in the developed photoresist. The uniformity of a pattern element across the area of the photolithographic mask is called critical dimension uniformity (CDU). In the article "Improving wafer level uniformity for logic utilizing mask level metrology & process," Photomask Technology, Proc. SPIE Vol. 8880, 0888025-1-0888025-7, 2013, the authors A. Cohen et al. present investigations that show that a CDCR (Critical Dimension Correction Ratio) generated by various pixel arrangements show a linear behavior for different feature types of photolithographic masks.

Apart from an optical transmission inhomogeneity, photolithographic masks can have further kinds or types of errors. An important type of defects of photolithographic masks is mask image placement errors or registration errors. This type of error or defect occurs if one or more pattern elements of a pattern arranged on a photolithographic mask are not precisely at their positions that are predetermined by the layout data of the mask. Another type of defect is a bending of the substrate of a photomask. A further important defect category of photolithographic masks is overlay errors.

The applicant has disclosed a method for correcting these and other errors of photolithographic masks by introducing or writing pixels into a substrate of a photomask. For example, this method is described in the U.S. Pat. No. 9,658,527 B2 of the applicant, the entire content of which is incorporated by reference. This method is already routinely used for reliably correcting several error types of photomasks. Nevertheless, there is room for a further improvement of this defect correction process.

SUMMARY

In a general aspect, the present invention provides a method and an apparatus for improving the above-mentioned method of correcting defects of a photolithographic mask.

According to an aspect of the invention, a method is provided for determining positions of a plurality of pixels to be introduced into a substrate of a photolithographic mask by use of a laser system, wherein the pixels serve to at least partly correct one or more errors of the photolithographic mask. The method comprises the steps of: (a) obtaining error data associated with the one or more errors; (b) obtaining first parameters of an illumination system, the first parameters determining an illumination of the photolithographic mask by the illumination system when processing a wafer by illuminating with the illumination system using the photolithographic mask; and (c) determining the positions of the plurality of pixels based on the error data and the first parameters.

Pixels that are introduced into a substrate of a photolithographic mask to correct various types of errors or defects of a photolithographic mask locally modify the optical transmission of the mask substrate. In the following, the benefit of the inventive method is mainly illustrated for the example of correcting critical dimension (CD) errors of a mask. However, the inventive method is not restricted to the correction of CD errors of photolithographic masks.

Pixels introduced or written into a mask substrate to correct for example registration errors, generate small scattering centers for the optical radiation transmitting the mask substrate. For example, the pixels that correct one or more registration defects introduce local inhomogeneities in the optical transmission of the mask when a repaired mask having pixels in its substrate is operated in an illumination system. Thus, the introduction of pixels correcting registration errors would result in a critical dimension (CD) variation across the photomask or a critical dimension uniformity (CDU) problem of the photolithographic mask.

To avoid a CDU problem when correcting registration errors, a distribution of a second type of pixel(s) may be determined simultaneously with the determination of the first type of pixels correcting the registration errors. The second type of pixel predominantly locally scatters the optical radiation impacting on the pixel in a defined manner. The second type of pixel essentially does not locally change the density of the substrate. Typically, the second type of pixel is introduced into a mask substrate together with the first type of pixel that corrects for example the error(s) of the photolithographic mask.

Both, the first type of pixel and the second type of pixel are not homogeneously distributed in the substrate of a photolithographic mask to be corrected. Hence, the optical radiation that transmits the mask substrate to generate an image of a pattern element arranged at different positions across a mask is subjected to different disturbances by the pixels in the mask substrate at various positions across the photolithographic mask. This means that the various numbers of pixels "seen" by the optical radiation imaging pattern elements at various positions across the mask result in a CD variation of pattern elements across the photolithographic mask.

But, even if the pixels would be homogeneously distributed within the mask substrate, different illumination settings of the illumination system would cause that the respective optical radiation distribution "sees" a different amount of scattering centers or pixels along its path through a photolithographic mask so that different illumination settings of the illumination system would generate different CD variations of the pattern elements arranged on a mask substrate.

The inventive method considers the optical radiation distribution of an illumination system that is used for illuminating a corrected photolithographic mask in a manufacturing process of semiconductor devices when determining the positions of the pixels to be introduced into the mask substrate in order to correct the one or more defects of the photolithographic mask. Hence, the optical radiation distribution the corrected photomask will see afterwards during its operation is taken into account when determining the positions of the pixels. Thus, the inventive method improves or optimizes the defect correction for a specific optical radiation distribution used during the operation of the corrected photolithographic mask in an illumination process of wafers for fabricating devices, as for example integrated circuits.

The at least one first type of pixel can locally modify a density of the substrate, and the at least one second type of pixel can locally modify the optical transmission of the substrate. The locally modified density and/or the local optical transmission of the photolithographic mask can be discontinuously modified within a plurality of small volumes of the photolithographic mask, wherein each small volume is called pixel. It is also possible that the locally modified density and/or in particular the optical transmission distribution of the photolithographic mask is continuously modified across the photolithographic mask by the plurality of pixels.

The one or more errors can comprise at least one of: at least one registration error of a pattern of the photolithographic mask, at least one optical transmission error of the substrate of the photolithographic mask, at least one planarity error of the substrate of the photolithographic mask, and at least one overlay error.

Apart from registration errors, the inventive method allows the correction of other types of defects of photolithographic masks in a similar process as illustrated above for registration errors. Typically, the correction of registration errors, planarity errors of the mask substrate, and/or overlay errors requires at least two different types of pixels. The correction of optical transmission defects of a photomask can be corrected using a single pixel type, although two or more types of pixels can also be used for correcting optical transmission inhomogeneities of mask substrates.

For the fabrication of devices, as for example integrated circuits, normally a series of photolithographic masks is successively applied on the same wafer during the manufacturing process in order to generate complex structures on the wafer. In many applications, the absolute location of the pattern elements with respect to the optical axis is not as important as the orientation of two or more masks relative to each other so that overlay critical structures can reliably be printed onto the wafer at predetermined positions. Thus, it is not the target to bring a first photolithographic mask to the best match with a predetermined design, but to obtain the best match with a second mask. The inventive method can also be used to correct such overlay errors of two or more photolithographic masks. In particular, the positions of the plurality of pixels to be introduced into the substrate of a first photomask and the plurality of pixels to be introduced into the substrate of the second photomask can be determined in a joint optimization process.

For registration defects, the error data may comprise differences between determined positions of pattern elements of the photolithographic mask and predetermined positions of the pattern elements that are associated with the layout data. For overlay errors, the error data may comprise differences between determined positions of pattern elements on the wafer illuminated with the illumination system using the photolithographic mask and predetermined positions of the pattern elements on the wafer. Further, for optical transmission errors or CD errors, the error data may comprise differences between a determined optical transmission distribution of the photolithographic mask and a predetermined optical transmission distribution of the photolithographic mask. It is also possible that the error data may comprise differences between the determined optical transmission distribution of the photolithographic mask, as for example a varying size of a feature element across the mask, and the predetermined optical transmission distribution of the photolithographic mask, as for example a uniform size of the feature element across the mask, and differences between determined positions of pattern elements on the photolithographic mask or on the wafer illuminated using the photolithographic mask and predetermined positions of the pattern elements on the photolithographic mask or on the wafer illuminated with the illumination system using the photolithographic mask.

The plurality of pixels can be arranged in a common layer of the substrate, and step c. of the inventive method can comprise determining a depth of the layer within the substrate.

For correcting registration errors, pixels are typically introduced in a layer that is arranged in the center or the half of the depth of the mask substrate. Pixels arranged in the center of the mask substrate essentially do not lead to a bending of the mask substrate. On the other hand, this means that a photolithographic mask that has a bending substrate may be corrected by introducing pixels in the upper half or the lower half of the substrate depending on the kind of bending. Of course, it is also possible to correct a photolithographic mask that has registration errors and a bended substrate at the same time. This means that two or more error types can simultaneously be corrected by a plurality of pixels.

As the scattering effect of the pixels depends on their arrangement in the mask substrate, it is necessary to know both, the depth (z-position) in which the pixels are to be introduced into the substrate as well as their positions within the layer (x- and y-position) in the mask substrate.

For obtaining a large local pixel density, it is possible to arrange the pixels in two or more layers within the depth of the substrate. The minimum distance between two layers along the depth can be about 10 µm for CDC (Critical Dimension Correction) type pixels and approximately 25 µm for RegC (Registration Correction) type pixels.

Step c. of the method defined above can comprise determining the positions of the plurality of pixels based on the error data, the first parameters, and second parameters associated with a linear imaging transformation performed by the illumination system.

The correction of mask defects can be improved by considering and using the flexibility of an illumination system used for illuminating a wafer through a photolithographic mask.

The positions of the plurality of pixels and the second parameters can be determined in a joint optimization process.

The simultaneous variation of the positions of the plurality of pixels and the second parameters of the illumination system expand the dimension of the variation space of the optimization process compared to a step-wise or successive optimization of these parameters. The expanded solution space of a joint optimization process for the positions of the pixels and the second parameters of the illumination system results in a reduction of the remaining error of the photolithographic mask that is not attainable with two successive separate optimization processes for the determination of the positions of the plurality of pixels and the determination of the second parameters of the illumination system. Thus, the application of the defined defect correction method increases the yield of a photomask fabrication process.

The positions of the plurality of pixels and the first parameters can be determined in a joint optimization process.

Typically, the first parameters of the illumination system are predetermined parameters and are not varied when determining the positions of the pixels in order to correct the error(s) of the photolithographic mask, whereas the second parameters of the illumination system are varied in order to determine the best defect correction of the photolithographic mask. However, if the first parameters of the illumination system are not fixed by constraints of the photomask illumination process, the first parameters can be determined in a joint optimization process together with the positions of the plurality of pixels to optimize the defect correction for the photolithographic mask. Therefore, the errors of a photolithographic mask are optimally corrected for a specific illumination setting of the illumination system used for illuminating a wafer through the corrected photomask.

The positions of the plurality of pixels, the first parameters and the second parameters can be determined in a joint optimization process.

By simultaneously determining the positions of the plurality of pixels as well as the first and the second parameters of the illumination system the best error correction can be achieved for a defective photolithographic mask. This is at the expense of the flexibility of the illumination system; the corrected photolithographic mask optimally works when illuminated with the illumination system having specific sets of the first and the second parameters.

The first parameters can comprise at least one of: an on-axis illumination setting, an annular setting, a dipole setting, a quadrupole setting, a disar setting, a quasar setting, and a source mask optimization (SMO) setting.

An illumination setting of the illumination system determines the illumination or the optical radiation distribution used for imaging the pattern elements of a photomask. Thus, the illumination setting influences the number of pixels the optical radiation passes on its way through the mask substrate. Additionally, the illumination setting or an aperture of the illumination system determining the illumination influences the angle under which the pixels are illuminated, and thus has an effect on the action of the pixels in a mask substrate.

The second parameters associated with the linear imaging transformation can comprise two parameters for a photolithographic mask shift, two parameters for a photolithographic mask scaling, and two parameters for a generalized rotation of the photolithographic mask.

The illumination of the illumination system can comprise at least one aperture determining the illumination of the photolithographic mask. In the following the illumination is also called illumination setting.

Obtaining the first parameters may comprise: deconvoluting an error correction map with a deconvolution kernel comprising an illumination pixel transmission.

The illumination pixel transmission may comprise the illumination and a pixel transmission.

For the following considerations, it is assumed that a photomask has several errors or defects, as for example CD (Critical Dimension) defects. The CD defects can be summarized in a CD error map $CD_E(x,y)$. The xy-plane is a plane that is parallel to a surface of the photolithographic mask. The z-direction is a direction that is perpendicular to the surface of the photolithographic mask or that is parallel to an optical axis of the illumination system. A CD error correction map $CD_C(x,y)$ correcting the CD defects of the mask is determined from the CD error map $CD_E(x,y)$. In the following, a plurality of pixels or pixel arrangements are determined which cause a CD change $\Delta CD(x,y)$ which reproduces the error correction map $CD_C(x,y)$ at the best. Thus, $CD_C(x,y)$ or $\Delta CD(x,y)$ describe the correction to be done.

As outlined in the second section, it has been found out that the introduction of one or more pixel arrangements having a pixel density $PD(x,y,z)$ leads to a proportional variation of the optical transmission $\Delta T(x,y)$ of the photolithographic mask when the photomask is illuminated by optical radiation at the actinic wavelength. As already indicated above, the pixels can be written everywhere within a depth d or a height of the mask depending on the error type to be corrected by the pixel writing process. For the correction of registration and/or CD errors, the pixels are typically written into half of the depth of the mask substrate to avoid a bending of the mask substrate, i.e. z=d/2. The side of the mask substrate on which the pattern elements are arranged is in following denoted the plane z=0. The pixel density $PD(x,y,z)$ is also called writing map $PD(x,y,z)$ in the following. It is the task to determine a writing map that generates the $\Delta CD(x,y)$ or $\Delta CD_C(x,y)$.

Further, it has also been detected that a change or a variation of the CD used for correcting CD errors, i.e. $\Delta CD(x,y)$ induced by the photomask having the one or more pixel arrangements is proportional in a wafer to the pixel density $PD(x,y,z)$:

$$PD(x,y,z) \propto \Delta T(x,y) \propto \Delta CD(x,y) \qquad (1)$$

As already indicated above, the induced CD variation, i.e. $\Delta CD(x,y)$, is selected so that it essentially reproduces the error correction map $CD_C(x,y)$.

Based on equation (1) an equation (2) can be formulated:

$$\Delta CD(x,y) = CDCR \cdot \Delta T(x,y) \qquad (2)$$

wherein the constant of proportionality CDCR (Critical Dimension Correction Ratio) has a unit of nm per % of optical attenuation, and wherein $\Delta CD(x,y)$ describes the critical dimension variation at the mask level.

The variation of the optical transmission $\Delta T(x,y)$ results in a variation of the size of the images generated by feature elements of the mask on a wafer, precisely in a photoresist layer $x_W$, $y_W$ arranged on the wafer, which is multiplied by the magnification or reduction factor of the projection objective used to image the pattern of feature elements of the mask onto the wafer. Typically, a reduction factor of 4 or 5 are presently used. When a reduction factor of four is assumed, this leads to the relation:

$$\Delta CD(x,y) = 4 \cdot \Delta CD_W(4 \cdot x_W, 4 \cdot y_W) \tag{3}$$

In another general aspect of the invention, a feature of the method described in this application is to determine a writing map $PD(x,y,z)$ that describes the positions of one or more arrangements of pixels that correct the one or more errors of a photolithographic mask, for example described by the CD error map $CD_E(x,y)$, when the one or more pixel arrangements are written or introduced into the substrate of a photolithographic mask.

An optical illumination $I_{opt}'(x_p, y_p)$ determined by an aperture of the illumination system generally has two effects on the writing map $PD(x,y,z)$ of pixels when transmitting a photolithographic mask: (I) The pixel density $PD(x,y,z=0)$ describes the optical attenuation of the illumination $I_{opt}'(x_p, y_p)$ when the pixels would be arranged in the same plane as the pattern elements of the mask substrate. $PD(x,y,z=0)$ or $PD(x,y)$ has the dimension of an aerial density or pixel per area, and $z=0$ is the plane of the photolithographic mask at which the pattern elements are arranged. (II) The function pixel transmission $PT'(x_p, y_p)$ accounts for the angle dependence of the scattering behavior of the pixels in a mask substrate when the pixels are written somewhere in a mask substrate. The pixel transmission varies across the pupil and is independent of the illumination setting. The unit of $PT'(x_p, y_p)$ is percent optical attenuation per pixel aerial density.

In the previous paragraph, the optical illumination $I_{opt}'(x_p, y_p)$ and the pixel transmission $PT'(x_p, y_p)$ are indicated in dimensionless pupil coordinates: $x_p = n \cdot \sin \Theta_x$, $y_p = n \cdot \sin \Theta_y$, wherein n is the refraction index of the mask substrate, and $\Theta_x$ and $\Theta_y$ are the angles of the illumination with respect to the optical axis or the z-axis. $\Theta_{mas}$ and $\Theta_{min}$ are fixed by the illumination setting. The optical illumination $I_{opt}'(x_p, y_p)$ and the pixel transmission $PT'(x_p, y_p)$ can be converted to mask coordinates x, y (see the description of FIG. 7 below):

$$I_{opt}(x, y) = I_{opt}'\left(d \cdot \tan\left(\arcsin\frac{x_p}{n}\right), d \cdot \tan\left(\arcsin\frac{y_p}{n}\right)\right), \text{ and} \tag{4}$$

$$PT(x, y) = PT'\left(d \cdot \tan\left(\arcsin\frac{x_p}{n}\right), d \cdot \tan\left(\arcsin\frac{y_p}{n}\right)\right), \tag{5}$$

wherein d is the height within the mask substrate as indicated above. It can be seen from equation (5) that for $d=0$, e.g. the pixels are arranged in the plane of the pattern elements and the pixel transmission has a constant numerical value:

$$PT(x,y) = PT(0,0) = \text{Const.} \tag{6}$$

The variation of the optical transmission $\Delta T(x,y)$ caused by the writing map $PD(x,y,z)$ can be expressed by an equation combining the quantities illumination setting, pixel transmission, and pixel density:

$$T(x,y) = [I_{opt}(x,y) \cdot PT(x,y)] * PD(x,y,z) = IPT(x,y) * PD(x,y,z), \tag{7}$$

"*" denotes a convolution and wherein $$IPT(x,y) = I_{opt}(x,y) \cdot PT(x,y). \tag{8}$$

IPT is called illumination pixel transmission. This quantity describes a weighted illumination, or it can be considered as an integral of the transmitted optical intensity. It can also be considered as a convolution kernel of the illumination illuminating the pixel density $PD(x,y,z)$. In case the illumination $I_{opt}$ and the pixel transmission PT are available in form of matrices, the multiplication in equation (8) is an element-by-element multiplication: $IPT(x,y) = I_{opt}(x,y) \odot PT(x,y)$. Equation (8) expresses that the optical transmission variation $\Delta T(x,y)$ is the convolution of the illumination pixel transmission with the pixel density or the writing map $PD(x,y,z)$.

In equation (7) $\Delta T(x,y)$ can be replaced using equation (2).

$$\frac{\Delta CD(x,y)}{CDCR} = \Delta T(x,y) = IPT(x,y) * PD(x,y,z) \tag{9}$$

Equation (9) shows that the pixel density or the writing map $PD(x,y,z)$ can be obtained by deconvoluting the convolution kernel $IPT(x,y)$ with the optical transmission variation $\Delta T(x,y)$ or the quotient of the CD variation $\Delta CD(x,y)$ and the constant CDCR.

The convolution can be performed by Fourier transforming each quantity in equation (9) and performing a multiplication of the quantities.

$$FT\left(\frac{\Delta CD}{CDCR}\right) = FT(IPT) \cdot FT(PD) \tag{10}$$

Thus, the pixel density $PD(x,y,z)$ can be determined by transforming equation (10):

$$PD(x, y, z) = FT^{-1}\left(\frac{FT\left(\frac{\Delta CD}{CDCR}\right)}{FT(IPT)}\right) = CDCR^{-1} \cdot FT^{-1}\left(\frac{FT(\Delta CD)}{FT(IPT)}\right) \tag{11}$$

wherein FT denotes the Fourier transform of the quantity in the bracket, and $FT^{-1}$ denotes the inverse Fourier transform. By applying an inverse Fourier transform, the quantities in equation (11) can be retransmitted in the position-space.

To determine the writing map $PD(x,y,z)$ without an approximation, the constant CDCR, the CD variation $\Delta CD(x,y)$, and the illumination pixel transmission or the convolution kernel $IPT(x,y)$ have to be determined in a calibration process. Before describing the general case of a calibration process, various approximations are discussed in order to simplify the calibration process.

In order to perform a calibration process in a first approximation, a pixel density $PD(x,y,z)$ is written into a calibration mask substrate having a low variation in the xy-plane of the mask substrate. Low variation of the pixel density $PD(x,y,z)$ means that a variation of the pixel density in a pixel plane or xy-plane can be ignored within the illumination area of the calibration mask defined by the illumination setting.

For a constant pixel density within the area in the illumination of the calibration mask and the additional assumption that the effect of the illumination of the pixels is considered as if the pixels would be arranged in the plane of the pattern elements of a photolithographic mask (i.e. z=0), the pixel transmission has a constant numerical value, $PT(x,y)=k$, the convolution in equation (7) can be executed:

$$\Delta T(x,y)=IPT(x,y)*PD(x,y)=\int IPT(x',y')dx'dy'\cdot PD(x,y,z)=\int (I_{opt}(x',y')\cdot PT(x',y'))dx'dy'\cdot PD(x,y,z)=k\cdot \int I_{opt}(x',y')dx'dy'\cdot PD(x,y,z)=C_1\cdot PD(x,y,z) \quad (12)$$

wherein $C_1$ is a constant having a dimension: [% att./(pixel/m$^2$)]=[% att.·m$^2$/pixel].

Performing the convolution in equation (7) is equivalent to considering the contribution of each point within the area illuminated by the illumination setting in the pixel plane of the calibration mask.

Equation (12) also follows from the relation (1). This means the relation (1) is based on the assumptions discussed above. Equation (12) allows for a simple transformation between a pixel density $PD(x,y,z)$ and a variation of the optical transmission variation $\Delta T(x,y)$ caused by the pixel density arranged within the mask substrate. Or expressed in other words, a pixel density that is essentially uniform across an illumination setting and that is assumed to be arranged in the plane of the pattern elements enables a determination of the constant $C_1$ and allows to transform a variation of the optical 1.5 transmission $\Delta T(x,y)$ in a related or dedicated pixel density $PD(x,y,z)$ or vice versa. Thus, based on the discussed assumptions, equation (12) allows for a calibration of a pixel writing process (see equation (13)).

Combining equations (2) and (12)

$$\Delta CD(x,y)=CDCR\cdot \Delta T(x,y)=C_1\cdot CDCR\cdot PD(x,y,z)$$

leads to the result:

$$PD(x,y,z)=\frac{\Delta CD(x,y)}{C_1\cdot CDCR} \quad (13)$$

The product of the constants $C_1\cdot CDCR$ has the dimension $$\left[\frac{m^2\cdot \% \text{ att.}}{\text{pixel}}\cdot \frac{m}{\% \text{ att.}}\right]=\left[\frac{m^3}{\text{pixel}}\right].$$

The assumption that the pixels are considered to be arranged in the plane of the pattern elements is now dropped. Rather, it is now assumed that the pixels are arranged somewhere in the substrate of a photolithographic mask and the angular dependence of the illumination setting is taken into account. But, in this second approximation, it is still assumed that the pixels act as perfect scattering centers, i.e. it is assumed that the pixels have a perfect spherical shape. This assumption leads to a pixel transmission $PT'(x_p,y_p)$ that is constant in the pupil plane of the aperture.

According to equation (5), a constant pixel transmission in the pupil plane results in a constant pixel transmission in the layer where the pixels are arranged:

$$PT(x,y)=PT'(x_p,y_p)=PT'\left(d\cdot \tan\left(\arcsin\frac{x_p}{n}\right),d\cdot \tan\left(\arcsin\frac{y_p}{n}\right)\right)=C_2$$

This assumption simplifies equation (7):

$$\Delta T(x,y)=[I_{opt}(x,y)\cdot PT(x,y)]*PD(x,y)=C_2\cdot I_{opt}(x,y)*PD(x,y,z). \quad (14)$$

Obtaining the first parameters may comprise: deconvoluting the error correction map with the deconvolution kernel comprising the illumination of the illumination system.

Then the pixel density or the writing map $PD(x,y,z)$ can be determined using equation (11):

$$PD(x,y,z)=FT^{-1}\left(\frac{FT\left(\frac{\Delta CD}{CDCR}\right)}{FT(IPT)}\right)= \quad (15)$$

$$FT^{-1}\left(\frac{FT\left(\frac{\Delta CD}{CDCR}\right)}{FT(C_2\cdot I_{opt})}\right)=CDCR^{-1}\cdot C_2^{-1}\cdot FT^{-1}\left(\frac{FT(\Delta CD)}{FT(I_{opt})}\right)$$

In this second approximation, the pixel density or the writing map $PD(x,y,z)$ is determined from the inverse Fourier transform of the quotient of the Fourier transform of the CD variation $\Delta CD(x,y)$ and the Fourier transform of the optical intensity $I_{opt}(x,y)$.

Finally, the assumption is dropped that the pixels act as perfect scattering centers. The non-perfect spherical shape lead to a scattering behavior of the pixels that depends on the angle with which optical radiation incidents on the pixels with respect to the z direction or the optical axis of the illumination system. Thus, the general case considered now takes into account an angle dependence of the scattering behavior of the pixels. It does not assume that the optical radiation transmitting one or more openings of an aperture has the same effect on the pixels of the mask irrespective of the position of the optical radiation within the opening of the aperture. Thus, this aspect considers the position of the optical radiation within one or more openings of an aperture on the effect on the pixels on its path through a photolithographic mask. The relation defined above can also be regarded as a spatial frequency dependence of a pixel response on the illumination or the optical radiation, as angles within an opening of an aperture correspond to spatial frequencies on a photolithographic mask. This effect increases when the angle of the illumination increases with respect to the z-direction, which corresponds to the optical axis of the illumination system. Therefore, there are two effects of using larger illumination settings. A first one is the extension of the illumination in the pixel level or pixel plane that increases with larger angles with respect to the optical axis. A second one is the augmentation of the variation of the pixel transmission $PT(x,y)$ across the illumination pupil for larger angles with respect to the optical axis.

In the general case presently discussed, the equations (7) and (11) are solved without any assumptions. To obtain the writing map $PD(x,y,z)$ for this general case, the illumination pixel transformation or the convolution kernel $IPT(x,y)$ has to be determined without any assumption.

Combining equations (2) and (7) leads to:

$$\frac{\Delta CD(x,y)}{CDCR}=$$

$$\Delta T(x,y)=[I_{opt}(x,y)\cdot PT(x,y)]*PD(x,y,z)=IPT(x,y)*PD(x,y,z)$$

Determining the illumination pixel transmission may comprise: deconvoluting the pixel density with the optical transmission variation. Determining the illumination pixel transmission may also comprise: deconvoluting the pixel density with the error correction map.

This equation can be transformed:

$$FT(\Delta T) = FT(IPT) \cdot FT(PD) \Rightarrow IPT(x, y, z) = FT^{-1}\left(\frac{FT(\Delta T)}{FT(PD)}\right) \text{ or} \quad (16)$$

$$IPT(x, y, z) = [I_{opt}(x, y) \cdot PT(x, y)] =$$

$$FT^{-1}\left(\frac{FT(\Delta T)}{FT(PD)}\right) = FT^{-1}\left(\frac{FT\left(\frac{\Delta CD}{CDCR}\right)}{FT(PD)}\right)$$

Thus, the illumination pixel transmission or the convolution kernel IPT(x,y) can be determined by writing a defined pixel density or writing map PD(x,y,z) in the mask substrate of a calibration mask and measuring the resulting CD variation. For the determination of the convolution kernel it is beneficial write a pixel density into a mask substrate that varies with a steep gradient in one or two directions.

After having fixed the convolution kernel IPT(x,y), the pixel transmission can be determined by dividing the convolution kernel IPT(x,y) by the illumination of the calibration mask $I_{opt}(x,y)$ determined by the illumination setting. This leads to:

$$PT(x, y) = \frac{IPT(x, y)}{I_{opt}(x, y)} = \frac{FT^{-1}\left(\frac{FT(\Delta T)}{FT(PD)}\right)}{I_{opt}(x, y)} \quad (17)$$

If the quantities IPT and $I_{opt}$ exist in the form of matrices, equation (17) transforms to an element-by-element division:

$$PT(x, y) = IPT(x, y) \oslash I_{opt}(x, y) = FT^{-1}\left(\frac{FT(\Delta T)}{FT(PD)}\right) \oslash I_{opt}(x, y).$$

Determining the deconvolution kernel of the illumination may comprise: (a) generating a reference mask having a plurality of pixels arranged with a varying pixel density; (b) illuminating several wafers with the reference mask using a monopole setting, wherein each wafer is illuminated with a different angle of the monopole setting relative to an optical axis of the reference mask; and (c) determining the deconvolution kernel of the illumination from a variation of the critical dimension of the several wafers.

It is the beneficial effect of this kind of determining the deconvolution kernel of the illumination or the illumination setting that it allows to calculate the deconvolution kernel for various illumination settings. This means that one calibration process enables the determination of a deconvolution kernel for all typically used illumination settings. But, this approach requires a large number of wafer prints, and thus is an expensive approach.

A dimension of the monopole setting in a pupil plane may comprise a range of 0.1 mm to 100 mm, preferably 0.5 mm to 50 mm, more preferred 1 mm to 20 mm, and most preferred 2 mm to 10 mm. An illumination angle may vary in a range from ±10°, preferably ±15°, and most preferred ±20° with respect to an optical axis of the illumination system. A number of wafer prints with varying illumination angle may comprise a range of 2 to 100, preferable 5 to 50, and most preferred 10 to 30.

Determining the deconvolution kernel of the illumination may comprise: (a) illuminating a wafer by a photolithographic mask with an illumination of the illumination system, wherein the photolithographic mask does not have the plurality of pixels, and determining a critical dimension of the wafer; (b) writing a pixel density into the substrate of the photolithographic mask; (c) illuminating the wafer by the photolithographic mask with the illumination of the illumination system, and determining the critical dimension; (d) determining a variation of the critical dimension by subtracting the critical dimension of step (a) from the critical dimension of step (c); and (e) determining the deconvolution kernel by deconvoluting the variation of the critical dimension with the written pixel density.

This aspect has the advantageous effect that only a single wafer print is necessary for the experimental determination of the convolution kernel for a specific illumination or a specific illumination setting. The just described aspect requires one calibration measurement for each illumination setting of the illumination system. Therefore, the calibration effort is proportional to the number of used illumination settings.

In case the illumination pixel transmission IPT(x,y) and the illumination pupil $I_{opt}(x,y)$ are available in the form of matrices, the optical transmission PT(x,y) can be determined by an element-by-element division of deconvolution kernel and the illumination pupil $I_{opt}(x,y)$.

It is possible to replace the deconvolution operation by varying the entries of the kernel function using an algorithm in order to obtain a best match between the results of the convolution and the observed CD variation ΔCD(x,y).

Different illuminations can comprise using different illumination settings of the illumination system. Using different illumination settings may comprise using different apertures of the illumination system.

Illuminating the reference mask may be replaced by or may additionally comprise: illuminating an aerial image measurement system (AIMS™) with the reference mask using different illuminations. Illuminating the photolithographic mask may be replaced by or may additionally comprise: determining the effect of the illumination on the pixels by comparing images of the photolithographic mask taken by the aerial image measurement system prior to and after introducing the pixels of varying pixel density into the mask substrate.

The defined method can further comprise the step of determining a type of each of the plurality of pixels.

A type of a pixel is characterized by a specific set of pixel parameters. The specific set of pixel parameters determines the major action of a pixel. For example, a first type of pixel can be designed that essentially locally changes a density of the mask substrate, and thus shifts one or more pattern elements of a photolithographic mask. Further, a second type of pixel having a second set of pixel parameters may essentially locally modify the optical transmission of the mask substrate without essentially locally changing the density of the substrate material.

The term "essentially" means in the context of this application the designation of a measured variable within its error margin when using state of the art metrology tools to measure the measured variable.

The positions of the plurality of pixels, their type, and the first and/or the second parameters can be determined in a joint optimization process.

The simultaneous determination of the type and the position of the plurality of pixels in combination with some or all the parameters of the illumination system provides the prerequisite for an optimal correction of a photolithographic mask.

A joint optimization process can comprise: (a) setting up a target functional comprising error data of the photlithographic mask, position data of the plurality of pixels, and the first parameters of the illumination system; and (b) minimizing the target functional by simultaneously varying the position data of the plurality of pixels.

The target functional can additionally comprise the type of the pixel and/or the second parameters of the illumination system. Further, the target functional can comprise error data of the photolithographic mask, position data of the plurality of pixels, the type of the pixel, the first parameters and/or the second parameters. Minimizing the target functional can comprise simultaneously varying the position data of the plurality of pixels and the type of the pixel. Moreover, minimizing the target functional can comprise minimizing the position data of the plurality of pixels, the type of the pixel, and the second parameters. Finally, minimizing the target functional can comprise minimizing the position data of the plurality of pixels, the type of the pixel, the first parameters, and/or the second parameters.

A Lagrange variational principle can be used to set up the target functional. Details of setting up a target functional and minimizing the target functional are described in the U.S. Pat. No. 9,658,527 B2 of the applicant.

The photolithographic mask may comprise a template for the nanoimprint lithography, or the photolithographic mask may comprise a transmissive optical element.

The defined method is not restricted to photolithographic mask. Rather, it can be applied to all transmissive optical elements that are to be corrected by introducing a plurality of pixels. In particular, the inventive method is important if the corrected transmissive optical element is operated with illumination settings having an off-axis optical intensity distribution.

The defined method can further comprise the step of determining laser beam parameters of the laser system based on the determined positions and the type of each of the plurality of pixels.

As discussed above, each type of pixel is associated with a specific set of pixel parameters. In order to write or to introduce a specific type of pixel into a substrate of a photolithographic mask a laser beam is necessary having a specific set of laser beam parameters associated with the respective type of pixel, i.e. the respective set of pixel parameters.

The laser beam parameters can comprise at least one of: an energy of the laser beam, a numerical aperture, a focus size, a beam polarization, a wave front shape, for example an astigmatism, a pulse length, a repetition rate, a number of pulses directed into one location of the substrate of the photolithographic mask, and a distance between two locations the laser beam is directed into the substrate of the photolithographic mask.

The types of each of the plurality of pixels can comprise at least a first type of pixel that is adapted to at least partly correct at least one of: a registration error, a planarity error and an overlay error, and at least one second type of pixel adapted to at least partly correct an optical transmission error of the substrate.

Laser beam parameters for introducing a first type of pixel may comprise: a pulse energy of 0.05 µJ to 5 µJ, a pulse length of 0.05 ps to 100 ps, a repetition rate of 1 kHz to 10 MHz, a pulse density of 1 000 pulses per $mm^2$ to 10 000 000 pulses per $mm^2$, a NA of an objective of 0.1 to 0.9, and a magnification of the objective of 5× to 40×. Laser beam parameter for introducing a second type of pixels may comprise: a pulse energy of 0.45 µJ-0.55 µJ, a pulse duration of 5-10 ps, a repetition rate of 10 kHz-100 kHz, a NA of the objective of 0.3-0.4, a magnification of the objective of 10×-20×, and a pulse density of 1 000-100 000 pulses per $mm^2$.

The defined method can further comprise the step of generating a writing map based on the positions and the type of the determined pixels, wherein the writing map may describe a distribution of the plurality of pixels to be introduced in the substrate of the photolithographic mask.

The establishment of a writing map PD(x,y,z) may be the result or the output of the method for determining the positions of the plurality of pixels. The writing map comprises the positions, the type of pixels to be introduced into the substrate of a defective mask and the depth into which the pixels are written into the mask substrate.

Thus, the writing map defines the parameters of the laser beam used for introducing the plurality of pixels into the mask substrate.

The method defined above may further comprise the step of introducing the plurality of pixels into the substrate of the photolithographic mask using ultra-short laser pulses of the laser system.

Introducing the plurality of pixel into the substrate may be based on the writing map.

The writing map may comprise a first plurality of pixel arrangements of the first type or kind of pixel and a second plurality of pixel arrangements of the second type of pixel.

A pixel arrangement comprises a plurality of pixels arranged in a constant density, i.e. the distance of identical pixels in a pixel arrangement is equidistant in one, two or three 1.5 dimensions. A pixel arrangement typically contains pixels of a single pixel type. For example, a pixel arrangement either comprises a first plurality of pixels of the first pixel type or a second plurality of pixels of the second pixel type.

A writing map PD(x,y,z) may comprise pixels of two or more pixel types. Thus, a single writing map may contain the overall information to correct the one or more errors of a photolithographic mask. It is also possible to establish a separate writing map for each type of pixels. For example, the density of the substrate of the photolithographic mask can specifically be modified by locally introducing pixels into the mask substrate according to first writing map having pixels or pixel arrangements of a first pixel type, and the optical transmission distribution of the mask can separately be modified continuously or discontinuously by using a second writing map describing a plurality of pixels of the second pixel type or a plurality of second pixel arrangements having pixels of the second pixel type. Thus, the correction of registration errors and the correction of errors of the optical transmission distribution of a photolithographic mask can also be separated.

The writing map may compensate an averaging effect of an illumination of the photolithographic mask by the illumination system having the first and/or the second parameters on the plurality of pixels when processing the wafer.

Compared to the prior art, the correction method described in a present application determines a modified writing map that takes into account the optical radiation distribution the corrected photomask is afterwards subjected to when determining the distribution of the plurality of pixels that serve for correcting the error(s) of the photolithographic mask.

The defined method may further comprise the step of increasing a density of pixel arrangements in the writing map and/or reducing the pixels density within the pixel arrangements in the writing map for compensating the averaging effect of the illumination of the illumination system. By increasing the density of the pixel arrangements in the writing map higher spatial frequency components are considered in the writing map. These higher frequency components lead to a locally increased or reduced pixel density.

A computer program may comprise instructions for causing a computer system to perform the steps of any of the aspects described above.

In a further embodiment, the above-mentioned problem is solved by an apparatus for determining positions of a plurality of pixels to be introduced into a substrate of a photolithographic mask by use of a laser system, wherein the pixels serve to at least partly correct one or more errors of the photolithographic mask. The apparatus comprises: (a) means for obtaining error data associated with the one or more errors; (b) means for obtaining first parameters of an illumination system, the first parameters determining an illumination of the photolithographic mask by the illumination system when processing a wafer by illuminating with the illumination system using the photolithographic mask; and (c) means for determining the positions of the plurality of pixels based on the error data and the first parameters.

The apparatus may further comprise the laser system adapted to generate ultra-short laser pulses.

The means for obtaining error data may comprise means for measuring the error data of the photolithographic mask.

The defined apparatus may further comprise means for determining an optical transmission variation across the photolithographic mask.

The means for determining the one or more registration errors of a pattern may comprise a PROVE® tool.

The illumination system may comprise a scanner or a stepper of a photolithographic exposure system.

Finally, the above defined apparatus may be adapted to execute the steps of any of the above described aspects.

DESCRIPTION OF DRAWINGS

To better understand the present invention and to appreciate its practical applications, the following Figures are provided and referenced hereafter. It should be noted that the Figures are given as examples only and in no way limit the scope of the invention.

FIG. 1 shows in cross-section of a schematic view of a transmissive photolithographic mask;

FIG. 2 schematically depicts a cross-sectional view of a template used in the nanoimprint lithography;

DETAILED DESCRIPTION

Figure 3:
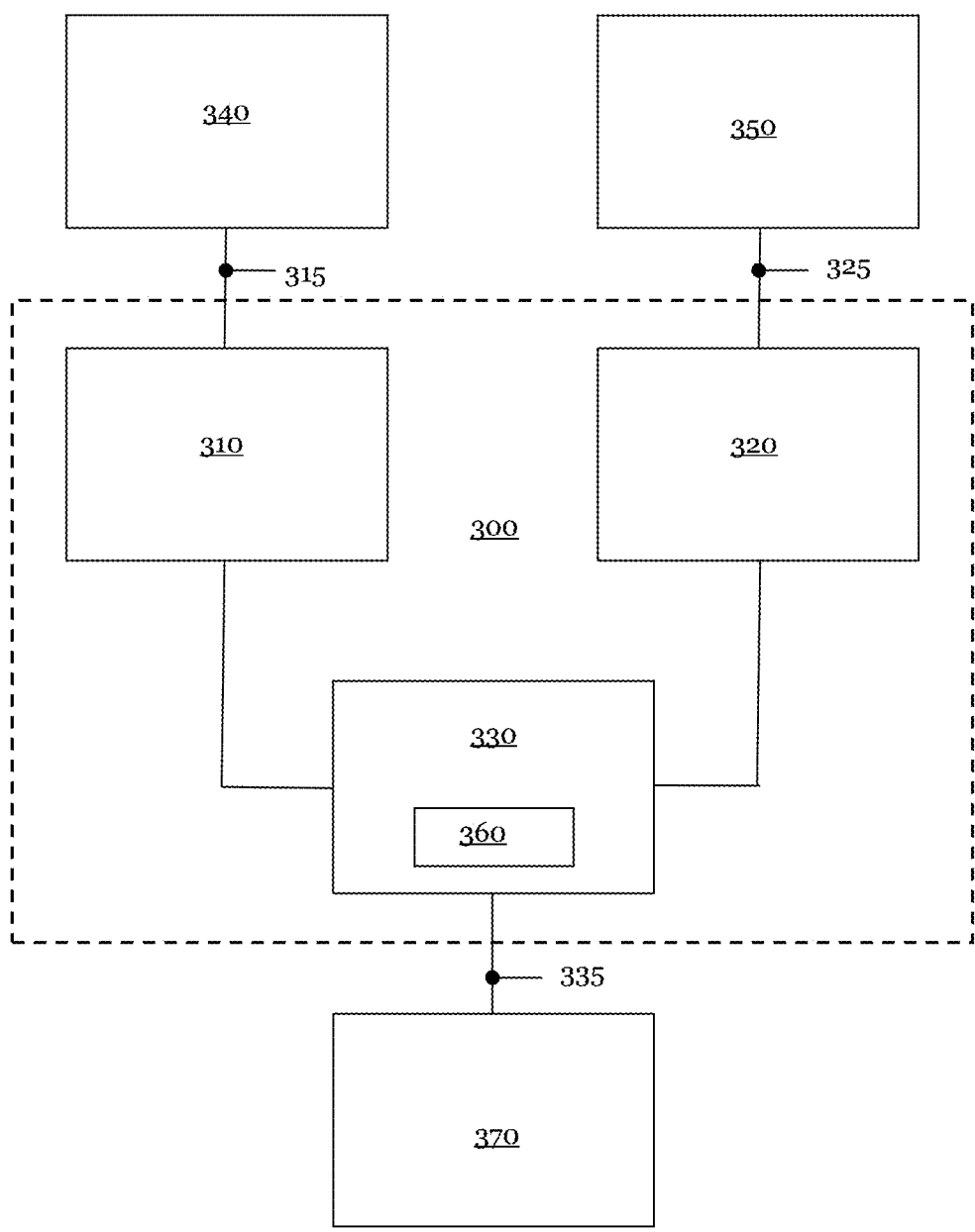
FIG. 3 schematically shows a block diagram of an apparatus for determining positions of a plurality of pixels to be introduced into a substrate of a photolithographic mask.

In the following, the present invention will be more fully described hereinafter with reference to the accompanying Figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

In particular, the inventive method is described in the context of photolithographic masks. However, the person skilled in the art will appreciate that the defined method is not restricted to the application of correcting defective photolithographic masks. Rather, the inventive method can be applied to all transmissive optical elements that are corrected by the introduction of a plurality of pixels. Further, the method described in this application can also be applied to correct templates for the nanoimprint lithography.

FIG. 1 represents a schematic cross-section view of a transmissive photolithographic mask 100. The mask 100 comprises a substrate 110 having a first or front surface 150 and a second or rear surface 160. The substrate 110 must be transparent for the wavelength used for the illumination of the photoresist on a wafer. This wavelength is called actinic wavelength. The exposure wavelength may be in the deep ultraviolet (DUV) spectral range of the electromagnetic spectrum, in particular around 193 nm. Typically, the substrate material comprises quartz. The substrate 110 typically has lateral dimensions of 152 mm×152 mm and a depth or height of essentially 6.35 mm. The substrate 110 of the photolithographic mask 100 has on its front surface 150 pattern elements 120 of a pattern 130 normally fabricated from chromium that images pattern elements 120 predetermined by the layout data in a photoresist arranged on a wafer. In the example depicted in FIG. 1, the mask 100 has an error 140 in the form of a registration error, i.e. the distance of two or more pattern elements 120 deviates from the position predetermined by the layout data. It is also possible that the error 140 may be a planarity error of the mask substrate 110, an overlay error, or an inhomogeneity of the optical transmission across the mask substrate 110.

The portion of the substrate 110 of the photolithographic mask 100 carrying pattern elements 120 is called an active area 170 of the mask 100, whereas the boundary portion that does not have pattern elements 120 is called a non-active area 180. A laser beam having the actinic exposure or illumination wavelength illuminates the substrate 110 of the mask 100 through the second or rear surface 160 of the substrate 110.

FIG. 2 schematically illustrates a template 200 used in the nanoimprint lithography to transfer pattern elements on a wafer. The template 200 comprises a material 210 that is transparent in the UV and DUV spectral range, often fused silica is used as a template material. The exemplary template 200 of FIG. 2 has an error 240. The pattern elements on the front template side 220 are fabricated in a process that is very similar to the fabrication of the pattern elements 120 of the photolithographic mask 100 of FIG. 1. Thus, the inventive principle can also be applied to correct various kinds of errors of a template 200 used in the nanoimprint lithography. The template 200 is illuminated by electromagnetic radiation 250 through the template rear side 230.

FIG. 3 schematically shows an apparatus 300 that can be used for determining positions of a plurality of pixels that are to be introduced in a photolithographic mask 100 or a template 200 for correcting one or more errors 140, 240 of the photomask 100 and the template 200, respectively. The apparatus 300 comprises a first interface 310 connecting the apparatus 300 to a metrology tool 340 via the connection 315. The external metrology tool 340 can analyze a photolithographic mask 100 and/or a template 200 to determine the error(s) 140, 240 of the photolithographic mask 100 and the template 200, respectively. The apparatus 300 obtains error data from the external metrology tool 340 by means of the interface 310. Thus, in the example shown in FIG. 3, the interface 310 of the apparatus 300 realizes means 310 for obtaining error data associated with one or more errors 140, 240.

The metrology tool 340 that measures the error(s) 140, 240 of a photolithographic mask 100 and a template 200, respectively, can be a laser system that can determine a CD (critical dimension) variation or a critical dimension uniformity (CDU) of pattern elements 120 across the mask 100, and can thus, for example, determine registration errors 140 of the photomask 100. For example, the metrology system 340 can be a PROVE® tool that can be used for measuring registration errors and/or overlay errors.

In addition to the metrology tool 340, the first interface 310 of the apparatus 300 can also be connected to a metrology tool that can measure a variation of the optical transmission across a photolithographic mask 100 and/or a template 200 as for example a WLCD tool (not represented in FIG. 3). Further, the first interface 310 may obtain layout data from a photomask design center that can be used for correcting overlay errors (not shown in FIG. 3). For example, if there are systematic effects, as for example an e-beam signature, a lens fingerprint, they can be predicted by additionally analyzing the layout data.

In another embodiment, it is possible to integrate the metrology tool 340 into the apparatus 300 (not depicted in FIG. 3).

Figure 4:
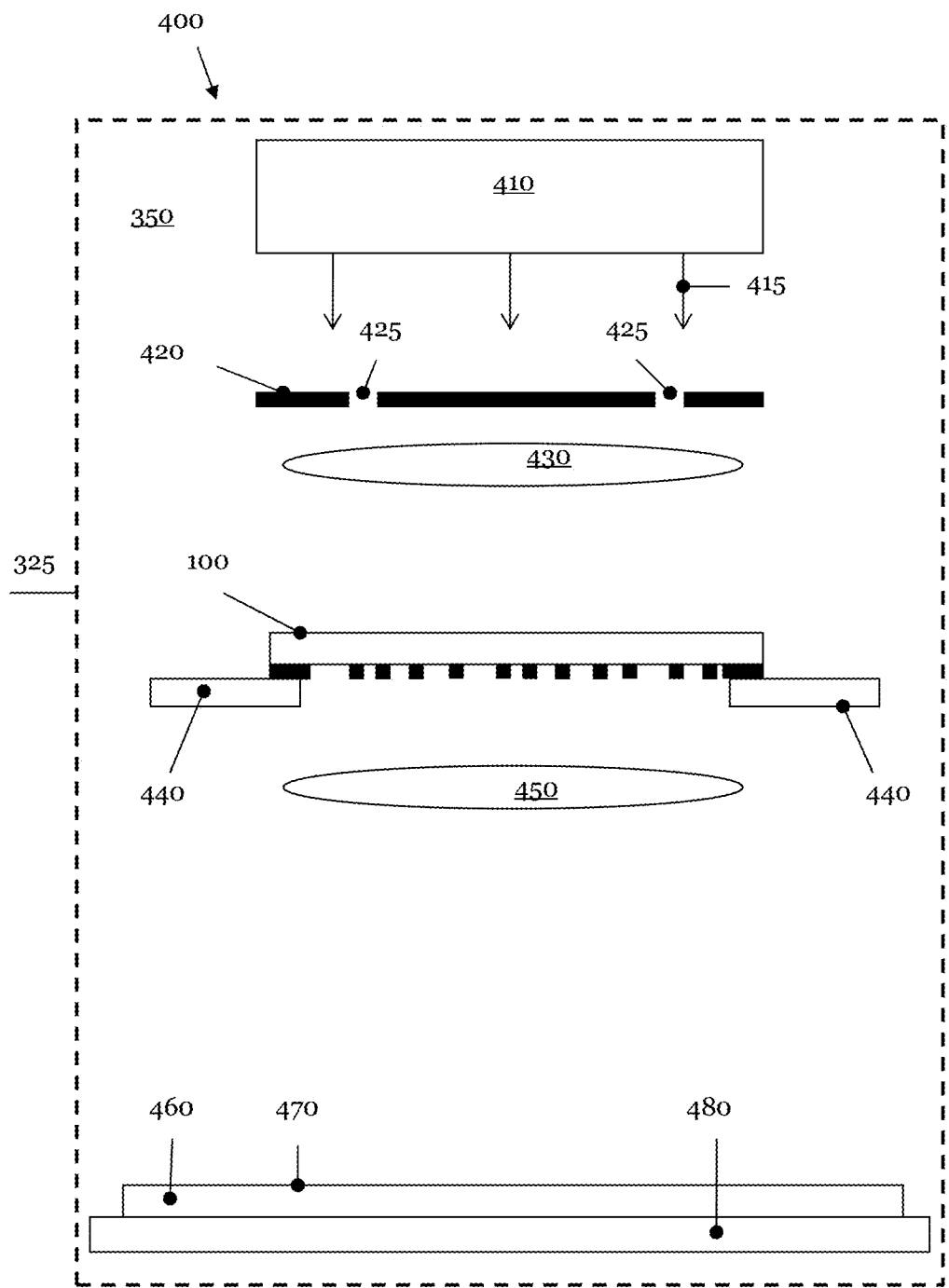
FIG. 4 schematically presents a cross-section of some components of an illumination system.

Further, the apparatus 300 comprises a second interface 320 that connects the apparatus 300 to the illumination system 350 via the connection 325. Hence, in the example depicted in FIG. 3, the interface 320 implements means 320 for obtaining parameters from the illumination system 350. The diagram 400 of FIG. 4 schematically shows a cross-section of some components of the illumination system 350. A light source 410, which may be a laser system, generates light at the actinic wavelength of the illumination system 350. An aperture 420 having one or more opening(s) 425 performs a spatial filtering to the light 415 generated by the light source 410. The aperture 420 determines the illumination setting of the illumination system 350. In the example presented in FIG. 4, the aperture 420 realizes an annular illumination setting. The aperture 420 realizes an exit pupil of the illumination system 350.

In the illumination system 350, the aperture 420 may be replaced by another aperture having different openings that generate a different illumination setting of the illumination system 350. The illumination system 350 may be able to set an on-axis or an off-axis illumination setting that best images the pattern 130 of the photomask 100 into the photoresist arranged on a wafer. The illumination system 350 can implement any requested illumination setting by changing the aperture 420. For example, apart from an annular illumination setting, the illumination system 350 can adjust a dipole illumination setting, a quadrupole illumination setting, a disar illumination setting, a quasar illumination setting, and a source mask optimization (SMO) setting. Further, instead of an aperture type of illumination setting, modules that allow more flexible illumination schemes can also be used, such as micro-mirror based, or faceted mirror based modules.

The light 415 that has transmitted through the opening(s) 425 of the aperture 420 impacts onto the condenser 430. The condenser 430 directs the light 415 to the rear side 160 of the photomask 100. The photomask 100 is not part of the illumination system 350. The mask 100 is fixed to a chuck 440 of the illumination system 350. The chuck 440 may be movable in three dimensions. Further, the chuck 440 may rotate the photomask 110 via two axes that are perpendicular to each other. Thus, the chuck 440 realizes a linear imaging transformation of the photomask 100. The linear imaging transformation of the photolithographic mask comprises two parameters for a mask shift, two parameters for a mask scaling, and two parameters for a generalized mask rotation.

The light 415 structured by the pattern 130 of the mask 100 enters the objective 450. The objective 450 images pattern element 120 of the mask 100 onto a photoresist 470 arranged on a wafer 460. Typically, the objective 450 reduces the size of the pattern elements 130 of the mask 100 by a factor of four or five on the photoresist 470 of the wafer 460. As already mentioned above, the wafer 460 is not part of the illumination system 350. The wafer 460 is fixed in the illumination system 350 by a second chuck 480.

The illumination system 350 has a connection 325 to the second interface 320 of the apparatus 300. The illumination system 350 can transmit its possible illumination settings as first parameters to the apparatus 300. The first parameters may be a fixed illumination setting determined by the aperture 420. It is also possible that the illumination setting is variable. In this case the illumination setting can transmit the available illumination settings to the apparatus 300. The first parameters may also comprise a position dependence of the illumination within one or more openings 525 of the aperture 425.

Typically, the determination of the illumination setting is part of the mask design process. This means that it is fixed during the mask layout process. Therefore, the illumination setting of the illumination system 350 is often obtained from the mask design software or from the database where the mask design is stored.

Further, the illumination system 350 communicates the range of the linear imaging transformations that the chuck 440 can perform to the apparatus 300. The available range of the linear imaging transformations is transmitted in form of an available range of the second parameters of the illumination system 350. In an alternative embodiment, the illumination system 350 communicates a fixed set of second parameters to the apparatus 300. This can be done if one, several or all parameters of the illumination system 350 are determined by one or more constraints the illumination system 350 should fulfil.

The illumination system 350 can be realized in the form of a lithographic scanner, also called scanner, or a lithographic stepper, also known as a stepper.

Again, with respect to FIG. 3, the apparatus 300 provides the error data obtained via the first interface 310 and the first and second parameters of the illumination system 350 via the second interface 320 to a processing unit 330 of the apparatus 300. The processing unit 330 varies position data of a plurality of pixels to determine the positions of the pixels that correct the error data based on the obtained error data. The plurality of pixels may comprise two or more kinds or types of pixels depending on the type of error 140, 240 to be corrected. A type of pixel is characterized by a specific set of parameters. The processing unit 350 may also determine an error map $CD_E(x,y)$ obtained via the first interface 310. The error map comprises a local amount of CD variation measured at the surface of a wafer having a photoresist.

The processing unit 330 may also vary the type of pixels when determining the positions of the pixels. The position data and the various kinds of pixels may be simultaneously varied in a joint optimization process. Further, the first parameters of the illumination system 350 associated with the illumination setting and/or the second parameters of the illumination system associated with the linear imaging transformation can also be varied depending on whether these parameters are fixed or not by the illumination system 300. The positions and the type of the pixels as well as the first and the second parameters of the illumination system 350 may be determined in a joint optimization process. Details of a joint optimization process are described in the U.S. Pat. No. 9,658,527 B2 of the applicant.

The positions of pixels determined in a joint optimization process can be summarized in a writing map PD(x,y,z) 360. The writing map PD(x,y,z) 360 may contain the positions and types of all pixels necessary to correct the error 140 of the mask 100. If this is the case, the writing map 360 typically comprises pixels of two or more pixel types. But, it is also possible to generate separate writing maps for each individual type of pixels $PD_i(x,y,z)$.

The pixels determined by the processing unit 330 may be arranged in several pixel arrangements. A pixel arrangement is characterized in that a density of pixels is constant within a pixel arrangement and a pixel arrangement only comprises one type of pixel. Typically, pixels or pixel arrangements are arranged in a layer within the substrate 110 of a photolithographic mask 100. Thus, a pixel density PD(x,y,z) or a pixel arrangement density is often a two-dimensional density PD(x,y,z=const.). But, it is also possible to arrange pixels or pixel arrangements as a one-dimensional structure or a three-dimensional volume PD(x,y,z).

The processing unit 330 may be realized in hardware, software, firmware or a combination thereof. The processing unit 330 may be a microprocessor, a general-purpose processor, a special purpose processor, CPU (Central Processing Unit), or the like. It may be part of a computer system, for example of the computer system implementing the apparatus 300. Alternatively, the processing unit 330 may be set-up as a separate unit such as a PC (Personal Computer), a workstation, a mainframe, etc. (not indicated in FIG. 3).

Figure 5:
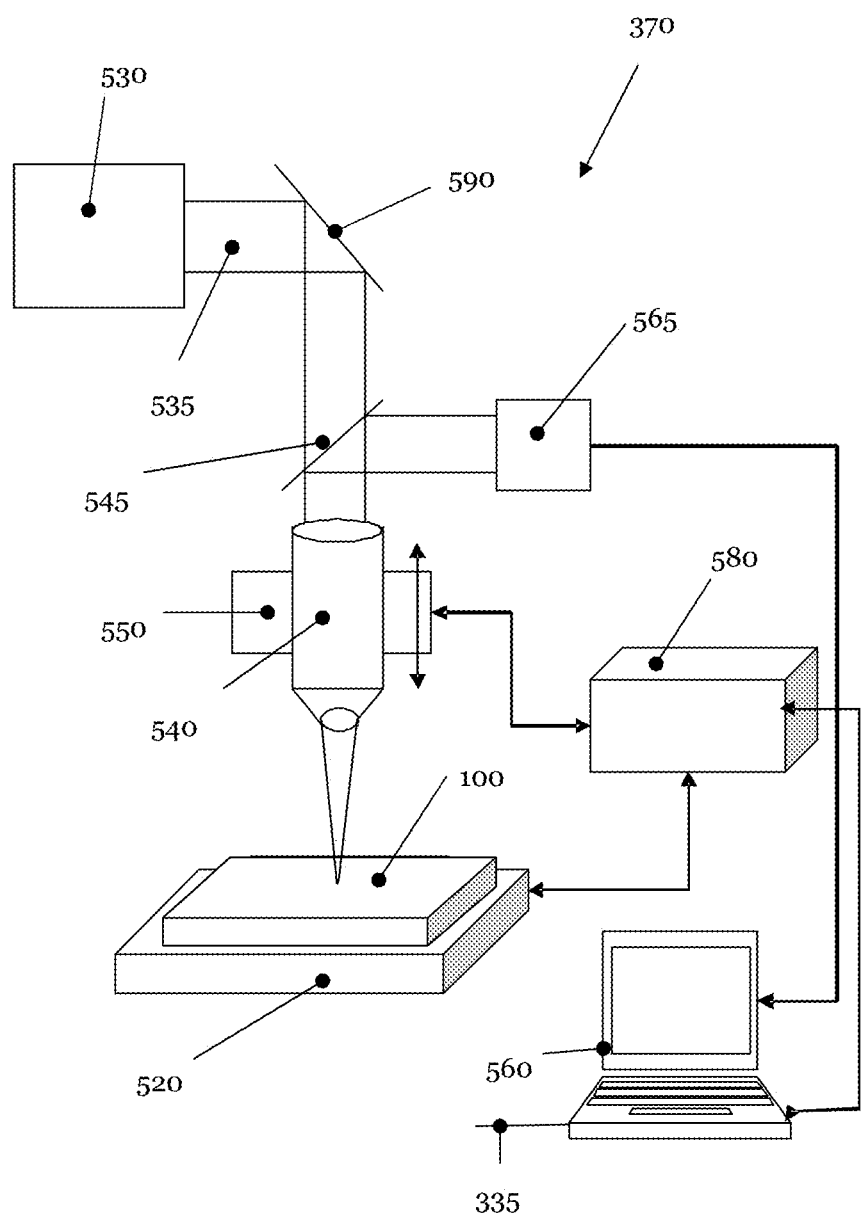
FIG. 5 schematically represents a block diagram of an error correction apparatus for modifying the substrate of the photolithographic mask of FIG. 1 and the template of FIG. 2.

The apparatus 330 can output the writing map(s) PD(x,y,z) 360 via the connection 335 to the error correction apparatus 370. FIG. 5 depicts a schematic block diagram of an exemplary error correction apparatus 370 that can be used to correct errors of the photolithographic masks 100 of FIG. 1 as well as of a template 200 of FIG. 2. The error correction apparatus 370 comprises a chuck 520 that may be movable in three dimensions. The photolithographic mask 100 may be fixed to the chuck 520 by using various techniques as for example clamping. The photolithographic mask 100 is mounted upside down to the chuck 520 so that its rear substrate surface 160 is directed towards the objective 540, or it may be the template 200 of FIG. 2. For specific conditions, it is also conceivable to introduce the pixel arrangements through the front side 150 of the photolithographic mask 100.

The error correction apparatus 370 includes a pulse laser source 530 that produces a beam or a light beam 535 of pulses or light pulses. The laser source 530 generates light pulses of variable duration. The pulse duration may be as low as 10 fs (femtosecond) but may also be continuously increased up to 100 ps (picosecond). The pulse energy of the light pulses generated by the pulsed laser source 530 can also be adjusted across a huge range reaching from 0.01 µJ per pulse up to 10 mJ per pulse. Further, the repetition rate of the light pulses comprises the range from 1 Hz to 100 MHz. For example, the light pulses may be generated by a Ti:Sapphire laser operating at a wavelength of 800 nm. However, the error correction method is not limited to this laser type, principally all laser types may be used having a photon energy that is smaller than the band gap of the substrate 110 of the photolithographic mask 100 and that are able to generate pulses with durations in the femtosecond range. Therefore, for example, Nd-YAG laser or dye laser systems may also be applied (not shown in FIG. 4).

The steering mirror 590 directs the pulsed laser beam 535 into the focusing objective 540. The objective 540 focuses the pulsed laser beam 535 through the rear substrate surface 160 into the substrate 110 of the photolithographic mask 100. The NA (numerical aperture) of the applied objectives 540 depends on the predetermined spot size of the focal point and the position of the focal point within the substrate 110 of the photolithographic mask 100 relative to the rear substrate surface 160. The NA of the objective 540 may be up to 0.9, which results in a focal point spot diameter of essentially 1 µm and a maximum intensity of essentially $10^{20}$ W/cm². The NA of the objective 540 may be even higher than 0.9, but the higher the NA the more constraints the design of the objective 540 have. Furthermore, it is beneficial that the objective 540 has a large working distance so that it allows to focus on the center of the mask 100 or even on the front side 150 of the substrate 110 of the photolithographic mask 100.

The error correction apparatus 370 also includes a controller 580 and a computer system 560 that manage the translations of the two-axis positioning stages of the sample holder 520 in the plane of the x- and y-direction. The controller 580 and the computer system 560 also control the translation of the objective 540 perpendicular to the plane of the chuck 520 (z-direction) via the one-axis positioning stage 550 to which the objective 540 is fixed. It should be noted that in other embodiments of the error correction apparatus 370, the chuck 520 may be equipped with a three-axis positioning system to move the photolithographic mask 100 to the target location and the objective 540 may be fixed, or the chuck 520 may be fixed and the objective 540 may be moveable in three dimensions.

The computer system 560 may be a microprocessor, a general-purpose processor, a special purpose processor, a CPU (Central Processing Unit), or the like. It may be arranged in the controller 580, or may be a separate unit such as a PC (Personal Computer), a workstation, a mainframe, etc. The computer system 560 may further comprise an interface that connects the computer system 560 with the apparatus 300 of FIG. 3 via the connection 335. Further, the computer system 560 may control the laser source 530 (not indicated in FIG. 5).

Further, the error correction apparatus 370 may also provide a viewing system including a CCD (Charge-Coupled Device) camera 565 that receives light from an illumination source arranged in the chuck 520 via the dichroic mirror 545. The viewing system facilitates navigation of the photolithographic mask 100 to the target position. Further, the viewing system may also be used to observe the formation of a modified area on the rear substrate surface 160 of the photolithographic mask 100 by the pulse laser beam 535 of the light source 530.

In a configuration not represented in FIGS. 3 and 5, the error correction apparatus 370 can be combined with the apparatus 300. If this configuration is realized, the processing unit 330 of the apparatus 300 may be implemented in the computer system 560 of the error correction apparatus 370.

Figure 6:
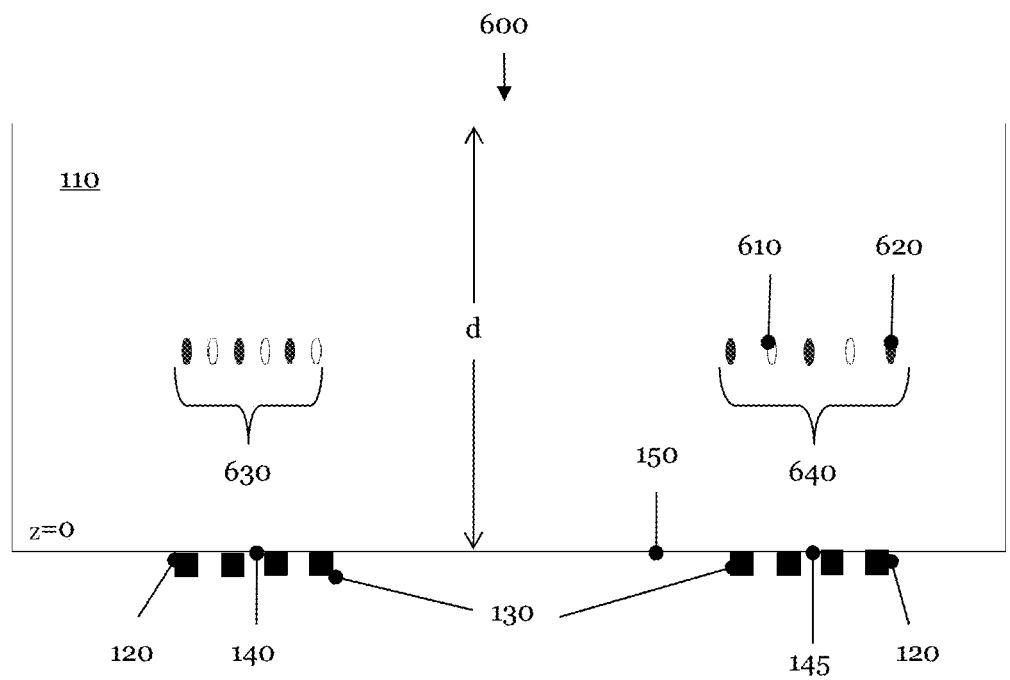
FIG. 6 schematically shows a cross-section through a photolithographic mask that is corrected according to the prior art.

FIG. 6 shows the determination of the positions of pixels that are presently used for the correction of CD (Critical Dimension) errors. In detail, FIG. 6 presents a section of the photomask 600. In the left part of the section of the mask 600 the pattern 130 has a CD error 140. In the right part of the section of the photomask 600, the pattern elements 120 of the pattern 130 have a second CD error 145 that shows a different amount of deviation of the pattern 130 from the predetermined layout data. To correct the CD errors 140, 145, CD data are taken from a wafer level CDU measurement. These data are interpolated to a denser grid to determine the desired attenuation value of the pixels to be introduced into the mask substrate 110 directly above the CD location having the defect 140, 145. For correcting the defect 140, 145, a number of pixel arrangements 610 and 620 are determined. Both, the pixel arrangements 610 and 620 have an area of 50×50 µm² and contain one type of pixel in a constant density. The pixel arrangements 610 and 620 can have a smaller or a larger area. The size of the pixel arrangements 610 and 620 of FIG. 6 is a trade-off between resolution, file size and computation speed. There is no principal technical limitation to use pixel arrangements 610, 620 having a smaller size. The pixels in the pixel arrangements 610 are designed to essentially correct the CD errors 140, 145, and the pixels in the pixel arrangements 620 are designed to essentially compensate the transmission inhomogeneity introduced in the mask substrate 110 by the pixel arrangements 610.

Further, it is possible to correct registration errors without introducing a too large amount of CDU. In this case the part of the defect does not occur which arises from writing pixels in the middle of the mask substrate instead of writing the pixels in a z-direction as close as possible to the plane where the pattern elements are arranged. In an alternative approach, it is also conceivable to accept a larger amount of registration correction that can subsequently be corrected by introducing a further layer of pixel arrangements 620 to recover a good CDU. For correcting registration errors, pixels may typically have a height of 10 µm to 15 µm. For correcting a transmission variation or a CDU, a pixel height may be approximately 5 µm.

The determination of pixel arrangements 630 and 640 having a different density of pixel arrangements considers the CD of the pattern elements 120 directly below the pixel arrangements 630 and 640. But, the current method of the CD correction does not consider the illumination setting of the illumination system 350 used when illuminating a wafer 470 through the corrected photolithographic mask 600.

Figure 7:
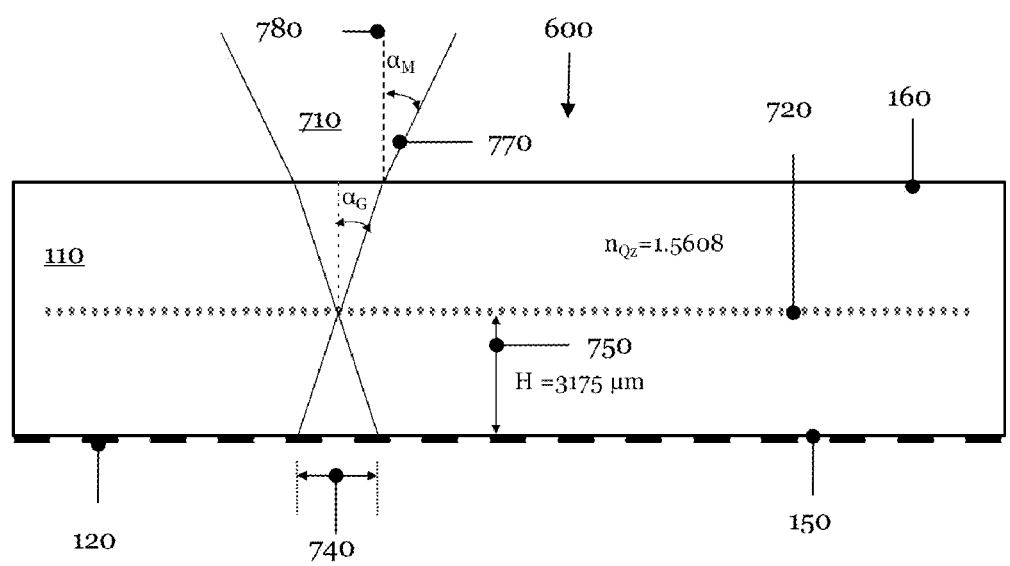
FIG. 7 schematically shows a distance within which a pixel arrangement contributes to a change of the optical transmission on the front side of a photolithographic mask.

FIG. 7 illustrates a drawback arising from this approach. FIG. 7 shows a cross-section through the photolithographic mask 600. As already discussed above, pixels or pixel arrangements 720 are typically introduced into the mid of the mask substrate 110 for the correction of registration errors or CD errors 140, 145, i.e. in a height of 3175 µm from the front side 150 of the mask substrate 110. This avoids bending of the mask substrate 110 when the pixel arrangements 720 are introduced or written into the mask substrate 110.

In the absence of pixels or the pixel arrangements 720 in the mask substrate 110, the pattern elements 120 are homogeneously illuminated by the optical radiation 710. The presence of pixels or pixel arrangements 720 in the mask substrate 110 changes this situation. In the following, the effect of a single pixel arrangement 720 is estimated on the pattern elements 120 arranged on the front side 150 of substrate 110. Modern illumination systems 370 use immersion lithography, thus the NA (numerical aperture) for the illumination of the wafer 460 typically amounts to: $NA_W=1.35$. If it is assumed that the projection objective 450 reduces the pattern element size by a factor of four, the NA at the level of the photomask 600 is: $NA_M=NA_W/4=1.35/4=0.34$. The angle between the marginal ray 770 and the optical axis 780 can be determined from Snell's law: $NA_M=n_M \cdot \sin \alpha_M = n_G \cdot \sin \alpha_G$, and assuming $n_M=1$, the angle $\alpha_G$ can be expressed: $\alpha_G=\arcsin[(\sin \alpha_M)/n_{Qz}]=\arcsin[NA_G/n_{Qz}]$. As it is indicated in FIG. 7, the refractive index of a quartz substrate 110 of the photomask 600 amounts to: $n_{Qz}=1.5608$. Based on these considerations, a distance $D_S$ 740 can be estimated within which a pixel arrangement 720 influences the local optical transmission on the front side 150 of the substrate 110. The diameter 740 can be calculated according to: $D_S=2 \cdot H \cdot \tan \alpha_G = 2 \cdot H \cdot \tan[\arcsin(NA_G/n_{Qz})]=1406$ µm. The distance 740 is also called spillover size $D_S$. If it is assumed that the incident optical radiation 710 has a circular shape, the area or spillover area can be estimated on which the pixel arrangement has an impact on: $A_S = \pi \cdot (D_S/2)^2 = 1.553 \text{ mm}^2$.

Figure 8:
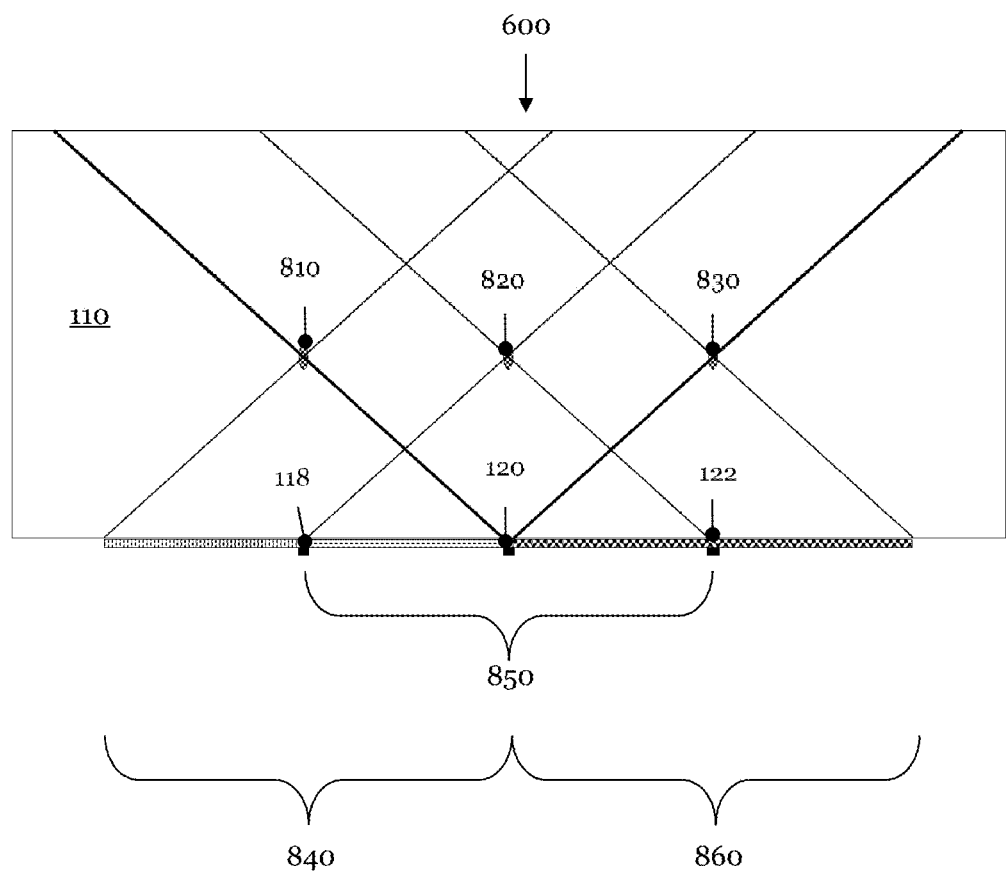
FIG. 8 schematically represents the effect of several pixel arrangements on the imaging of a single pattern element of a pattern of a photolithographic mask.

FIG. 8 schematically depicts the above considerations. FIG. 8 shows a cross-section of a part of the photomask 600. The mask 600 has on its front side 150 pattern elements 118, 120 and 122. In the mid of the mask substrate 110 pixel arrangements 810, 820 and 830 have been introduced. The pixel arrangements 810, 820 and 830 have lateral dimensions of 50×50 µm². Each pixel arrangement 810, 820 and 830 contains one type of pixel. The pixel arrangements 810, 820 and 830 may contain the same type of pixel or may comprise different types of pixels. In the context of FIG. 7 it is described that a pixel arrangement 810, 820, 830 effects the optical radiation incident on this pixel arrangement 810, 820, 830 across a distance $D_S \approx 1400$ µm and an area $A_S \approx 1.6$ mm², respectively. Thus, in the example presented in FIG. 8, the pixel arrangement 810 generates an optical attenuation by scattering within the distance symbolized by the reference sign 840. Hence, the pixel arrangement 810 influences the image generation of the pattern elements 118 and 120, and thus the CD of these pattern elements. The optical radiation of the actinic wavelength incident on the pixel arrangement 820 attenuates the optical radiation within the distance symbolized by the reference sign 850. In the depicted example, the pixel arrangement 820 has an influence on the CD of the pattern elements 118, 120 and 122. Further, the pixel arrangement 830 has an effect on the CD of the pattern elements 120 and 122.

This means that the pattern element 120 receives optical radiation subjected to an averaging effect of the pixel arrangements 810, 820 and 830. In the prior art, the effect of the pixel arrangement 820 has only been considered on the image generation of the pattern element 120. In a similar manner, the effect of the attenuation of the pixel arrangement 810 and 830 has been restricted to the pattern element 118 and 122, respectively.

Figure 9:
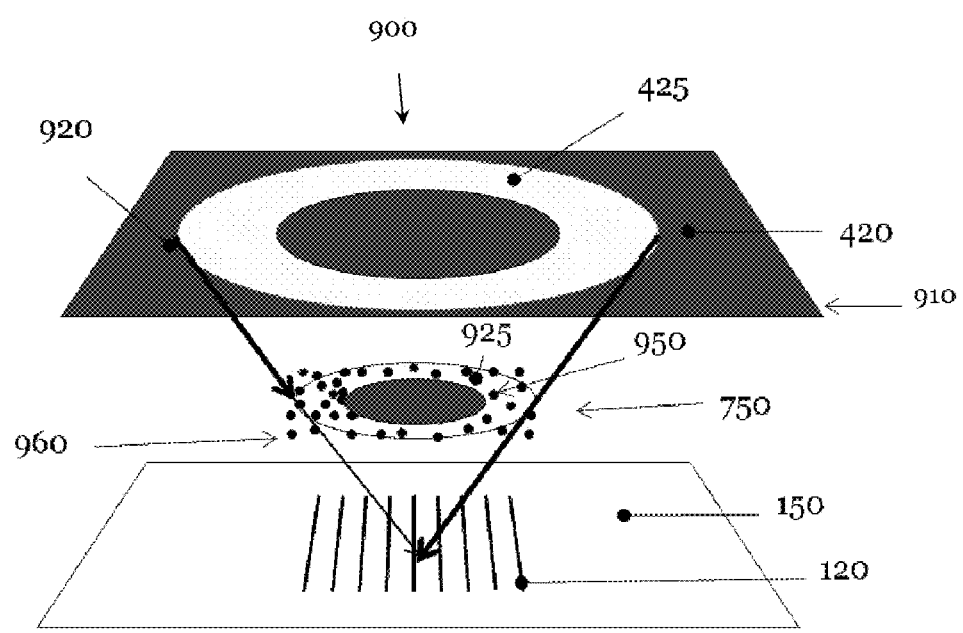
FIG. 9 schematically illustrates the influence of an illumination setting of an illumination system on a critical dimension (CD) variation of a pattern element of a pattern of a photolithographic mask.

The diagram 900 of FIG. 9 schematically shows the imaging of pattern elements 120 of a pattern of a photolithographic mask 600 that has pixel arrangements 950, 960 in the mid of the mask substrate 110. FIG. 9 represents the aperture 420 having the opening 425 projected into the pupil plane 910 of the illumination system 350. In the example depicted in FIG. 9, the illumination system 350 has again an annular illumination setting with an opening 425. The plane 750 represents the mid of the mask substrate 110. The optical radiation 920 passing through the opening 425 of the aperture 420 projects an illuminating area 925 onto the plane 750 in which the pixel arrangements 950 and 960 are located. The optical radiation 920 illuminates the pattern elements 120 that are arranged on the front side 150 of the photolithographic mask 600. The pixel arrangements 950 that are within the projected area 925 of the aperture 420 contribute to the image of a pattern element 120 generated by the optical radiation 920. The pixel arrangements 960 that are outside of the projected area 925 essentially do not see the optical radiation 920 formed by the aperture 420, and thus do not contribute to the imaging of the respective pattern element 120. To improve the CD variation introduced into a photolithographic mask 600 by introducing a writing map PD(x,y,z) for error correction, it is required to take into account the spillover effect of a pixel arrangement 950.

It is also clearly seen from FIG. 9 that both, the density of the pixel arrangements 950, 960 and the distribution of the optical radiation 920 used for illuminating the photolithographic mask 600 have an effect on the locally generated dose of the optical radiation, and thus on the CD variation of the pattern elements 120 imaged by a corrected photolithographic mask. Thus, it is necessary to consider the impact of the illumination setting of the illumination system 350 when determining a CD variation that causes a correction of the defects 140, 145 by the introduction of pixel arrangements 950, 960 into the photolithographic masks 100, 600.

For the correction of the CD error map $CD_E(x,y)$ different approximations can be used. In a first approximation, it is assumed that the pixels act as scattering centers having a spherical shape for the optical radiation 920 incident on the pixels. This relation is expressed in equations (14) and (15) indicated above. In a second approach, this restriction of the scattering behavior of the pixels is removed. As already indicated above, the scattering effect of a pixel or a pixel arrangement depends on the angle the optical radiation incidents on the pixel or the pixel arrangement. This effect is caused by a non-spherical shape of a pixel. Thus, in the general case, a variation of the angle of the optical radiation incident on the projected area 925 within the projected area 925 on the effects of the pixels is considered. Equations (7) and (11) describe the general case.

Figure 10:
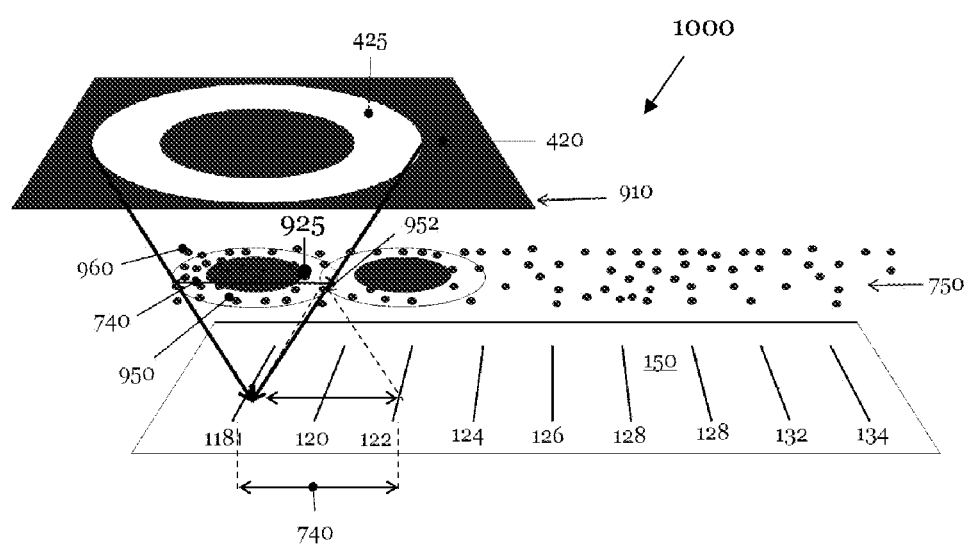
FIG. 10 schematically depicts both, the effect of a single pixel arrangement and an illumination setting on a critical dimension uniformity (CDU) of pattern elements of a photolithographic mask.

The diagram 1000 of FIG. 10 combines the effects of FIGS. 8 and 9. FIG. 10 schematically represents a section of a photomask 600 that has on its front side 150 pattern elements 118, 120, 122, 124, 126, 128, 132, 134. Pixel arrangements 950 and 960 are arranged in the mid of the mask substrate 110 in a layer 750. The pixel arrangements 950 and 960 are non-homogeneously distributed in the layer 750. One single pixel arrangement 952 can have an effect on several pattern elements 118, 120 and 122, as is illustrated by the arrows 740 in FIG. 10. Further, the effective attenuation of a specific pattern element, which is pattern element 118 in FIG. 10, is determined by the number of pixel arrangements 950 that are illuminated in the projected area 925 and the angle distribution under which the optical radiation incidents on the pixel arrangement 950. The number of pixel arrangements 950 within the projected area 925 depends on both, the local density of the pixel arrangements 950 and the illumination setting of the illumination system 350.

Figure 11:
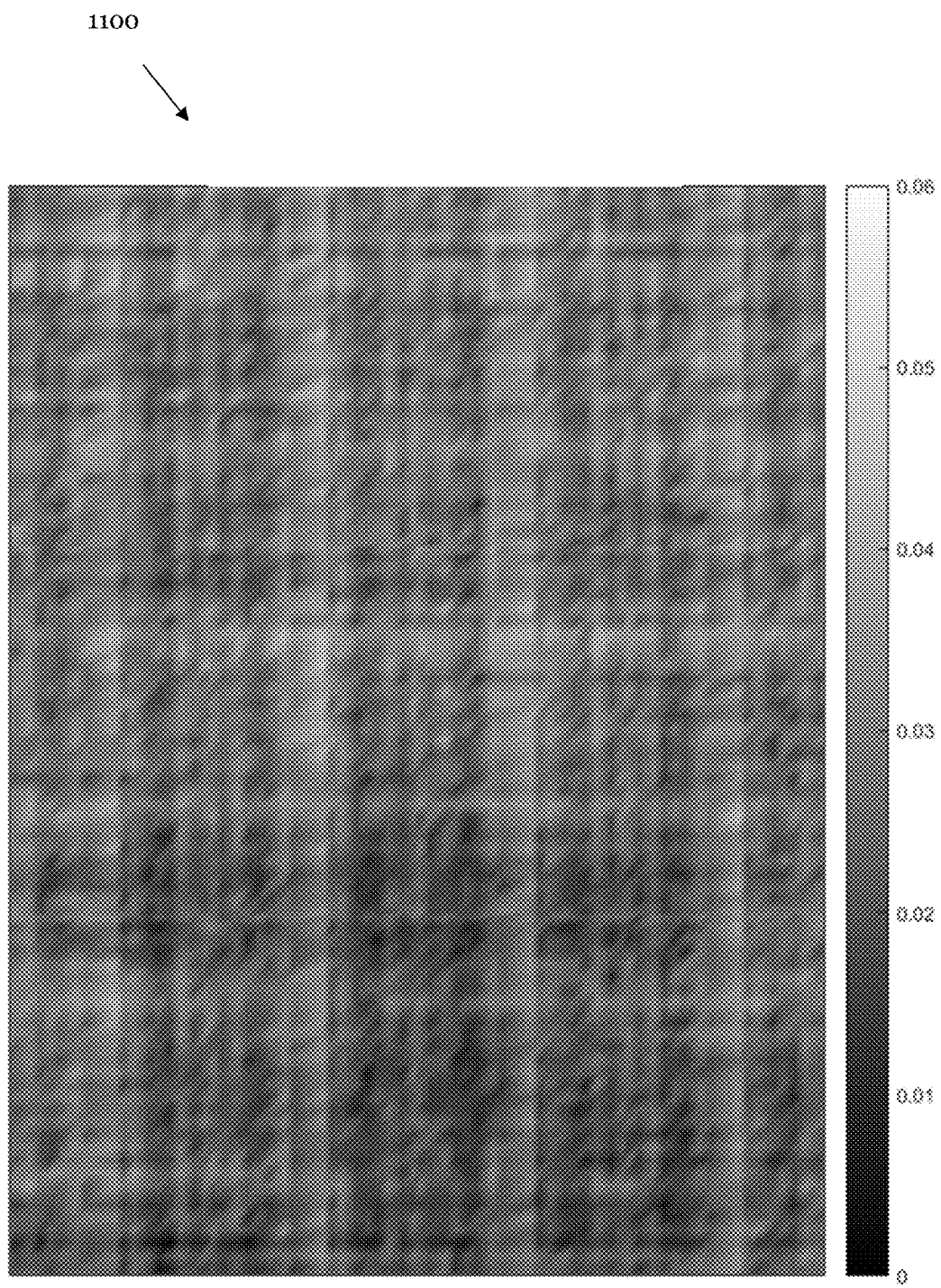
FIG. 11 shows a writing map for correcting a non-uniform optical transmission across a photolithographic mask, wherein the photolithographic mask is illuminated with an off-axis optical intensity distribution.

FIG. 11 shows the effect of a conventional writing map PD(x,y,z) that is introduced in the mid of a substrate 110 of a photolithographic mask 600 PD(x,y,z=d/2) and causes a variation of the optical transmission $\Delta T(x,y)$ 1100 of the mask substrate 110. The writing map PD(x,y,z) can contain a single type of pixel arrangements 610 or 620 or may comprise pixel arrangements 610, 620 having two or more types of pixels. In the example represented in FIG. 11, the writing map exclusively comprises pixel arrangements 620 that correct a local optical transmission nonuniformity of the substrate 610 of the mask 600, i.e. the CD error correction map $CD_E(x,y)$. The maximum allowed local variation or reduction of the optical transmission $\Delta T_{max}$ of the mask substrate 610 caused by the pixel arrangements 620 of the writing map PD(x,y,z=d/2) is 6%, as it is indicated by the greyscale on the right side of FIG. 11. The variation of the optical transmission is calculated according to equation (12).

Figure 12:
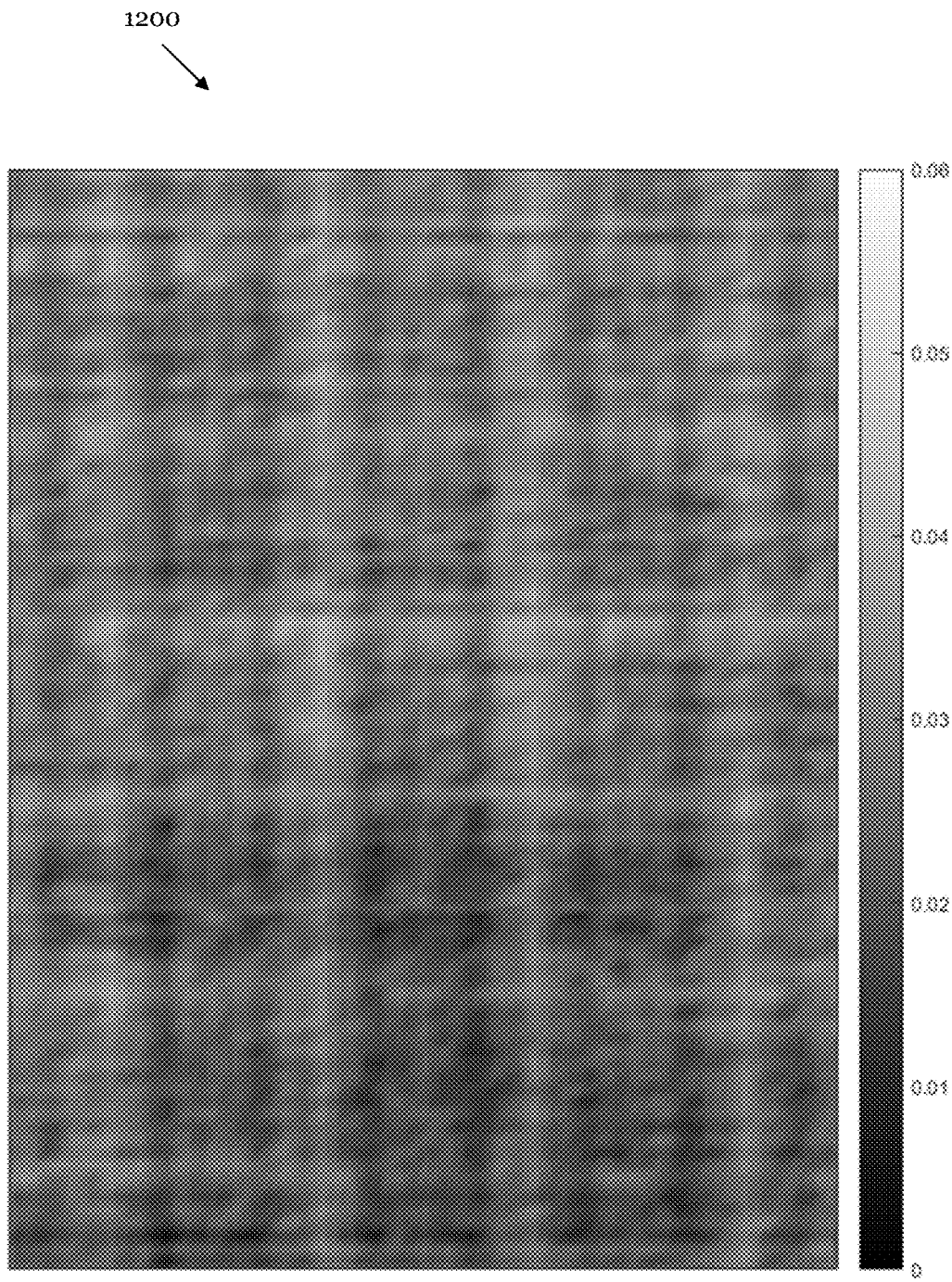
FIG. 12 represents the writing map of FIG. 11 as imaged by the illuminating radiation at a front surface of a photolithographic mask where the pattern is arranged.

FIG. 12 depicts the writing map of FIG. 11 as it is "seen" by a wafer illuminated through the photolithographic mask 600 having the writing map or pixel density PD(x,y,z) by the illumination system 350. The effective attenuation $\Delta T_C(x,y)$ 1200 at the front side 150 of the photolithographic mask 600 is different than the attenuation $\Delta T(x,y)$ 1100 predetermined by the writing map. In particular, the attenuation pattern of the writing map $\Delta T_C(x,y)$ 1200 is smoothed at the plane 150 of the mask 600 where the pattern elements 120 of the pattern are arranged. Thus, the optical attenuation $\Delta T_C(x,y)$ 1200 generated by the writing map at the front side 150 of the mask 600 does not fully represent the intended attenuation or the optical attenuation $\Delta T(x,y)$ 1100 predetermined by the writing map. As it can be recognized from FIG. 12, the pixel arrangements 620 generate a smoothed or averaged writing map $\Delta T_C(x,y)$ 1200 at the front side 150 of the mask 600 compared with the calculated writing map $\Delta T(x,y)$ 1100 of FIG. 11.

The CDU range to be corrected by the CD error correction map $CD_C(x,y)$ caused by the writing map PD(x,y,z) is approximately 6 nm in the specific example of FIG. 11, and is thus rather high. Further, the CDC (Critical Dimension Correction) rate is in the range of 0.5 nm CDC change per 1% optical attenuation of the optical radiation incident on the mask substrate 110. In the specific example of FIG. 11, the correction of the CD variation requires the introduction of several CDC layers in the mask substrate 110. Therefore, the writing of several closely spaced layers of pixel arrangements 620 can induce registration errors. This effect should be considered when determining the writing map PD(x,y,z).

Figure 13:
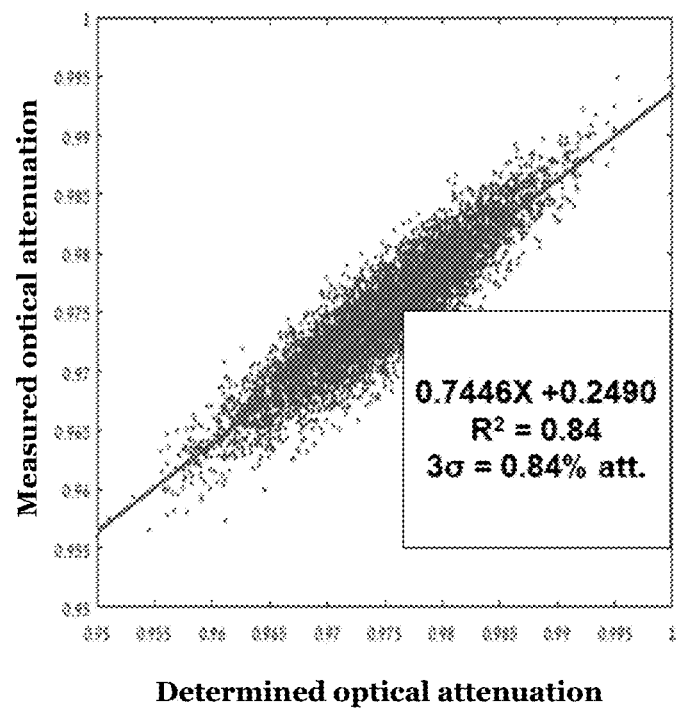
FIG. 13 depicts a linear regression of a measured optical attenuation vs. the optical attenuation predetermined by the writing map of FIG. 11.

FIG. 13 shows the result of introducing the writing map PD(x,y,z) into the substrate 110 of a photolithographic mask 600. As can be seen from FIG. 13, the smoothing or averaging effect of the writing map caused by the pixel arrangements 620 when illuminating the photolithographic mask 600 with the illumination system 350 leads to a variation of the determined optical attenuation $\Delta T(x,y)$ 1100 represented in the writing map with respect to the measured optical attenuation $T_C(x,y)$ 1200 across the photomask 600. The measured optical attenuation $T_C(x,y)$ 1200 is not equal to the target attenuation T(x,y) 1100 in FIG. 13. Further, the width of the distribution is rather high, and the slope is not correct. Both findings indicate smoothing effects caused by a convolution of the illumination pixel transmission and the writing map PD(x,y,z) as indicated in equation (9).

Figure 14:
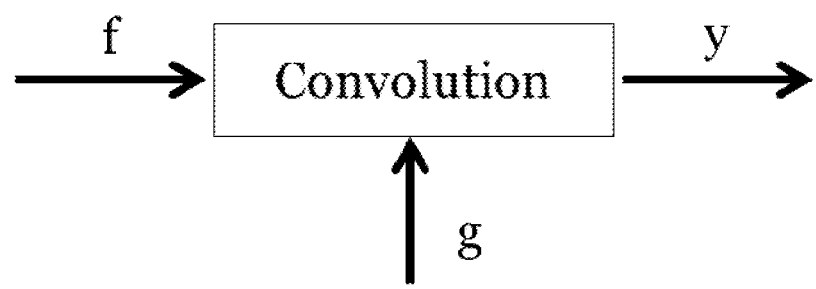
FIG. 14 schematically shows a convolution of the writing map of FIG. 11 with the optical radiation of the illumination system and the effect of a pixel arrangement when illuminating a corrected photolithographic mask.

Thus, the effective writing map $PD_C(x,y,z)$ of FIG. 12 acting at the front side 150 of the photomask 600 on the pattern elements 120 can be considered as a convolution of the writing map PD(x,y,z) of FIG. 11 and the effect of the pixel arrangements 620, 630 in the substrate of the mask substrate 110. This relation is illustrated in FIG. 14. A function f of the writing map PD(x,y,z) is convoluted with the action g of the pixel arrangements 620, 630 (PD(x,y,z) $\rightarrow PD_C(x,y,z)$). The result is an effective function y that is represented by the effective writing map $PD_C(x,y,z)$ of FIG. 12.

As discussed in the context of FIG. 10, the optical radiation 920 covers a projected area 925 in the layer 750 where the pixel arrangements 610 and 620 are located that has approximately a distance of $D_S \approx 1400$ μm and an area $A_S \approx 1.6$ mm$^2$. As described in the context of FIG. 6, a pixel arrangement 610, 620 typically has an area of 50×50 μm$^2$. If it is assumed that the distance between different pixel arrangements 610, 620 corresponds to the diameter of the pixel arrangement 610, 620, more than 100 pixel arrangements 610, 620 contribute to the optical intensity at the location of a pixel element 120. Potentially each pixel arrangement 610, 620 can have its own pixel type so that each individual pixel arrangement can have its own scattering characteristic. Further, the optical radiation passing through the opening 425 of the aperture 420 typically incidents on the pixel arrangements having different angles with respect to the optical axis of the illumination system 350.

In order to generate an optimal writing map, the illumination setting of the illumination system 350 should be considered when determining the positions and the type(s) of pixels that are to be introduced in the mask substrate 110. The illumination setting is represented by the first parameters of the illumination system 350. When determining the positions and/or the type of the pixels, a target CD $\Delta CD_C(x,y)$ of the photomask 600 should also be taken into account. In a first approach, the optimal writing map is generated by iteratively varying the optical attenuation of each pixel arrangement 950 that is hit by the optical radiation 920 in order to obtain the best correction performance $\Delta CD(x,y)$. Alternatively, or additionally, the density of the pixel arrangements 620 can also be varied to determine an optimized writing map.

In a second approach, the optimal writing map PD(x,y,z) can be obtained from equation (11). To obtain the optical writing map, a deconvolution is generated for the convolution of the illumination pixel transmission IPT(x,y) and the writing map PD(x,y,z) as indicated in equation (9). As it is indicated by equation (11), the optical writing map PD(x,y,z) can be determined by an inverse Fourier transform of the quotient of the Fourier transform of the CD variation and the Fourier transform of the illumination pixels transmission or the convolution kernel IPT(x,y). The convolution kernel IPT(x,y) can be obtained from equation (16).

The deconvolutional kernel IPT(x,y) of the illumination or the illumination setting can be determined by two different ways. In a first approach, it is possible to write a plurality of pixels or pixel arrangements 610, 620 in a substrate 110 of a reference mask or a calibration mask. The reference mask is then used for illuminating various wafers 460 using various illumination settings. Preferably the various wafers are illuminated using a monopole setting and systematically varying the angle of the monopole setting with respect to the optical axis. By analyzing the CD variation of the various wafers 460, the deconvolution kernels of various illumination settings can be determined.

In a second approach for determining the deconvolution kernel IPT(x,y) of the illumination setting, the CD change $\Delta CD(x,y)$ of a plurality of pixels is determined by measuring a wafer 460 prior to and after the introduction of the pixels into the substrate 110 of a reference or a calibration mask 100, 600. When using the second approach, it is beneficial if the reference mask has pixels or the pixel arrangements 610, 620 with a steeply varying pixel density in the x- and/or the y-direction.

Figure 15:
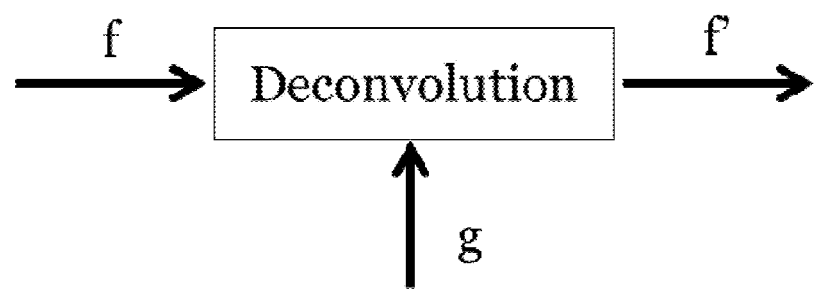
FIG. 15 schematically depicts a deconvolution of the writing map of FIG. 11 to undo the effect of the pixel arrangements introduced in a mask substrate on a specific distribution of the optical radiation illuminating the photolithographic mask.
Figure 16:
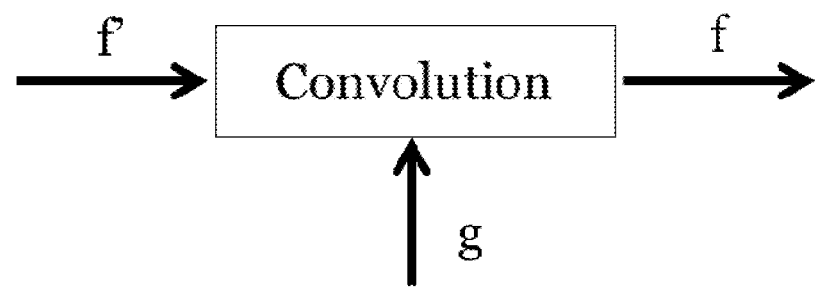
FIG. 16 schematically shows a convolution of a de-convoluted or optimized writing map and the effects of a specific optical radiation distribution on pixel arrangements introduced in a substrate of a photolithographic mask to correct one or more errors of the photolithographic mask.

FIG. 15 symbolizes the deconvolution process. The deconvolution is a process that undoes the effect of the convolution. A function f describing the effect of the writing map $PD_C(x,y,z)$ 1100 is deconvoluted with the action g of the pixel arrangements 610, 620. This results in a modified function f' that generates an optimized writing map. The optimized writing map PD(x,y,z) is a deconvoluted writing map $PD_C(x,y,z)$ that will generate the intended effect of the writing map PD(x,y,z) or the target optical attenuation map $\Delta T(x,y)$ in the plane 150 of the pattern 130 of the photolithographic mask. FIG. 16 illustrates this relation. Starting with the deconvoluted function f the action of the function g, i.e. the effect of the pixel arrangements 610, 620 in the plane 750 will generate the function f, i.e. the intended or the target writing map PD(x,y,z) in the plane 150 of the pattern 130 of the photolithographic mask 600.

Figure 17:
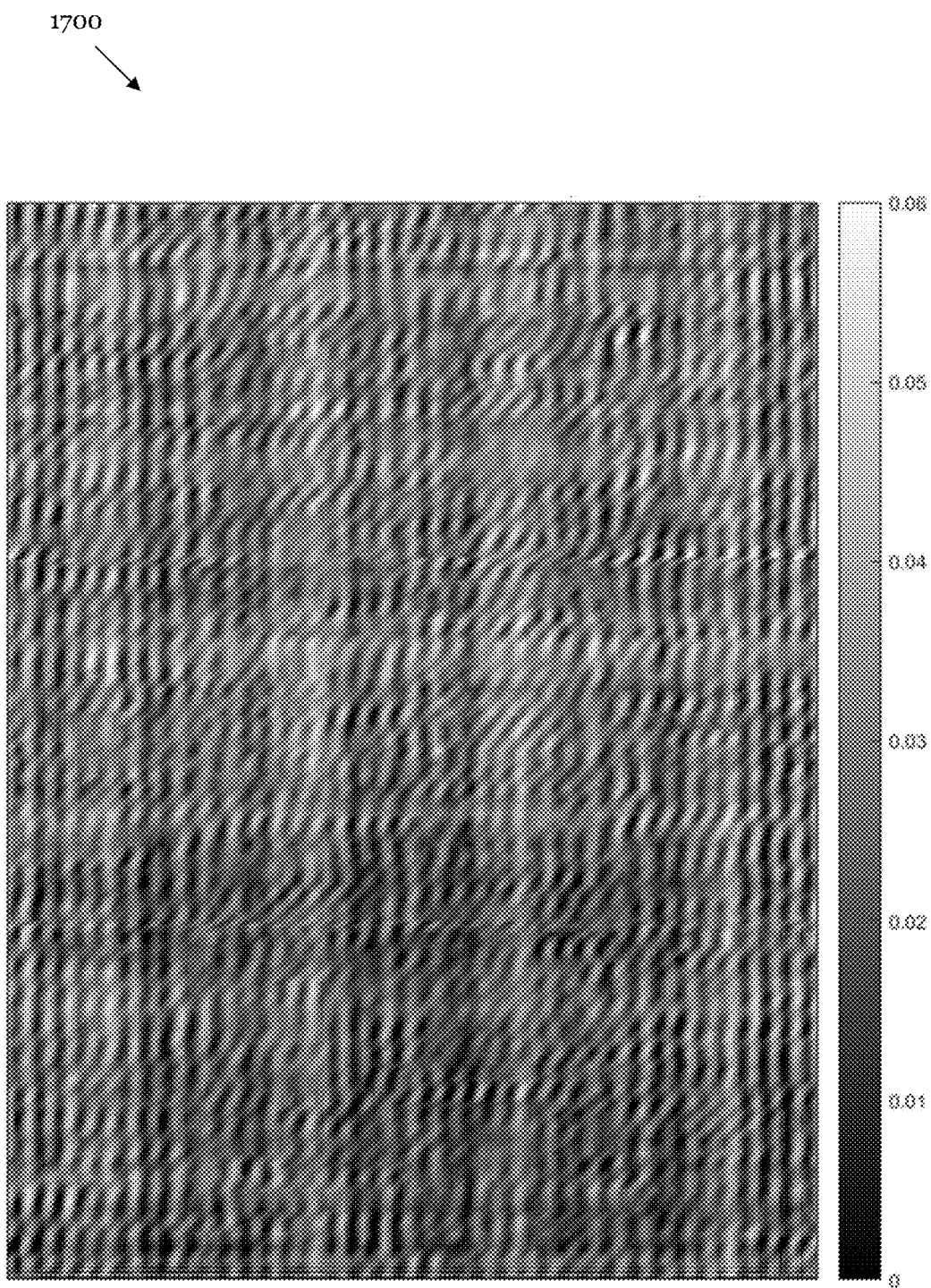
FIG. 17 presents the de-convoluted writing map of FIG. 11, the de-convoluted writing map is an optimized writing map for a specific illumination setting of the illumination system used for illuminating a corrected photolithographic mask.

FIG. 17 shows the effect of the optical transmission variation $\Delta T(x,y)$ 1700 of the deconvoluted writing map $PD_C(x,y,z)$ of the intended or target writing map PD(x,y,z) for FIG. 11. As can be clearly seen from FIG. 17, the optical variation $\Delta T(x,y)$ 1700 corresponding the target writing map PD(x,y,z) contains significant smaller structures than the optical transmission variation ΔT(x,y) 1100 of FIG. 11. This difference is caused by considering the effect of a specific optical radiation distribution on the pixel arrangements 950 within the projected area 925 on the image of each pattern element 120 when determining the writing map PD(x,y,z) belonging to the optical transmission variation $\Delta T_D(x,y)$ 1700 of FIG. 17. In this sense, the deconvoluted writing map PD(x,y,z) is an optimized writing map for correcting defect(s) 140 of the photolithographic mask 100. The pixel arrangements 620 determined by the deconvoluted or optimized writing map PD(x,y,z) are introduced or written into the substrate 110 of the photolithographic mask 600 to correct the error(s) 140.

The person skilled in the art will appreciate that a deconvoluted or optimized writing map PD(x,y,z) 1700 can be determined for all types of defects of photolithographic masks 100. In particular, a deconvoluted writing map $PD_D(x,y,z)$ can be determined which corrects two or more different types of errors of the photolithographic mask 100.

The deconvoluted writing map PD(x,y,z=const.) just comprises pixel arrangements 620 written in one layer 750. Further improvements of the optimized writing map PD(x, y,z) can be achieved by introducing pixel arrangements 620 in two or more layers.

Figure 18:
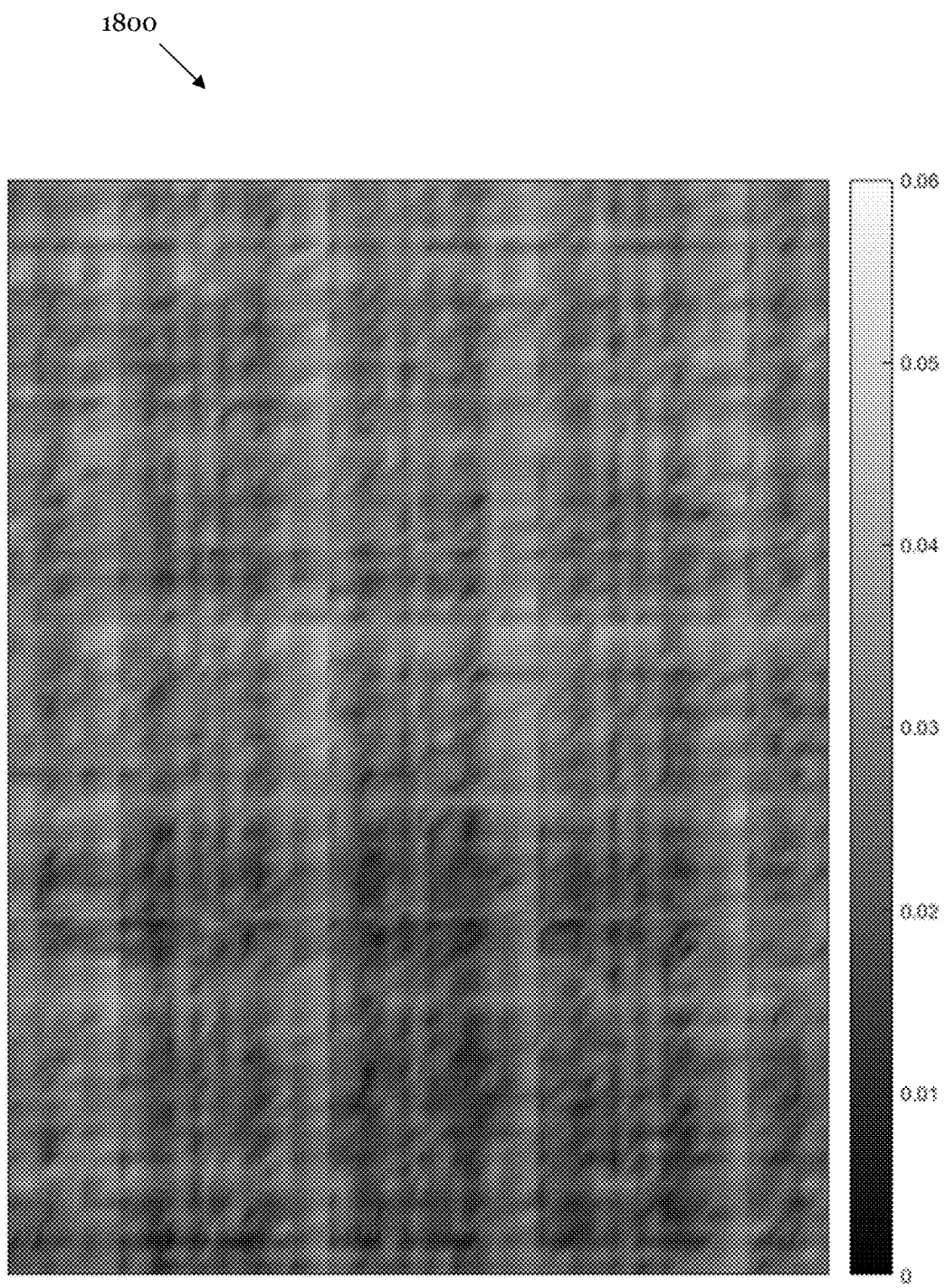
FIG. 18 depicts the de-convoluted writing map of FIG. 17 in a plane of the pattern of a photolithographic mask where the pattern is arranged, the writing map is essentially identical to the target writing map of FIG. 11.

FIG. 18 depicts the optical attenuation or optical transmission variation ΔT(x,y) 1800 that is generated at the plane 150 of the pattern 130 of the photolithographic mask 600 when pixel arrangements 620 according to the optimized writing map PD(x,y,z) are introduced into the mask substrate 110. The optical radiation 920 spatially filtered by the illumination setting of the illumination system 350 smooths or averages the fine pixel arrangements 620 of the optimized writing map PD(x,y,z) to the target attenuation or optical transmission variation ΔT(x,y) 1100 of FIG. 11 on the front side 150 of the substrate 110 of the photolithographic mask 600. The optical attenuation or optical transmission variation ΔT(x,y) 1800 of FIG. 18 almost perfectly reproduces the target attenuation or optical transmission variation ΔT(x, y) 1100 of FIG. 11.

Figure 19:
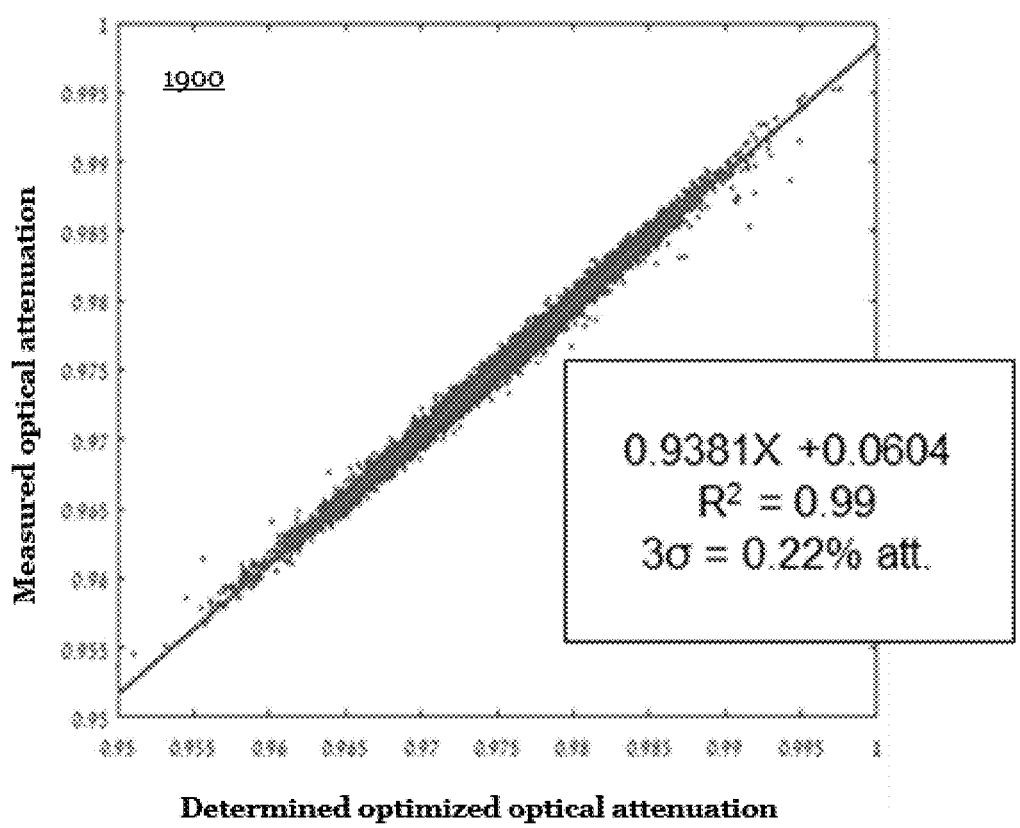
FIG. 19 represents a linear regression of a measured optical attenuation vs. the optical attenuation of the de-convoluted or optimized writing map of FIG. 17.

FIG. 19 shows the result of introducing the optimized writing map PD(x,y,z) into the substrate 110 of a photolithographic mask 600. Compared to FIG. 13, the error correction based on the optimized writing map PD(x,y,z) has significantly improved the agreement between the targeted or intended optical attenuation variation or optical transmission variation across the photolithographic mask 600 and the measured optical attenuation or transmission variation.

Figure 20:
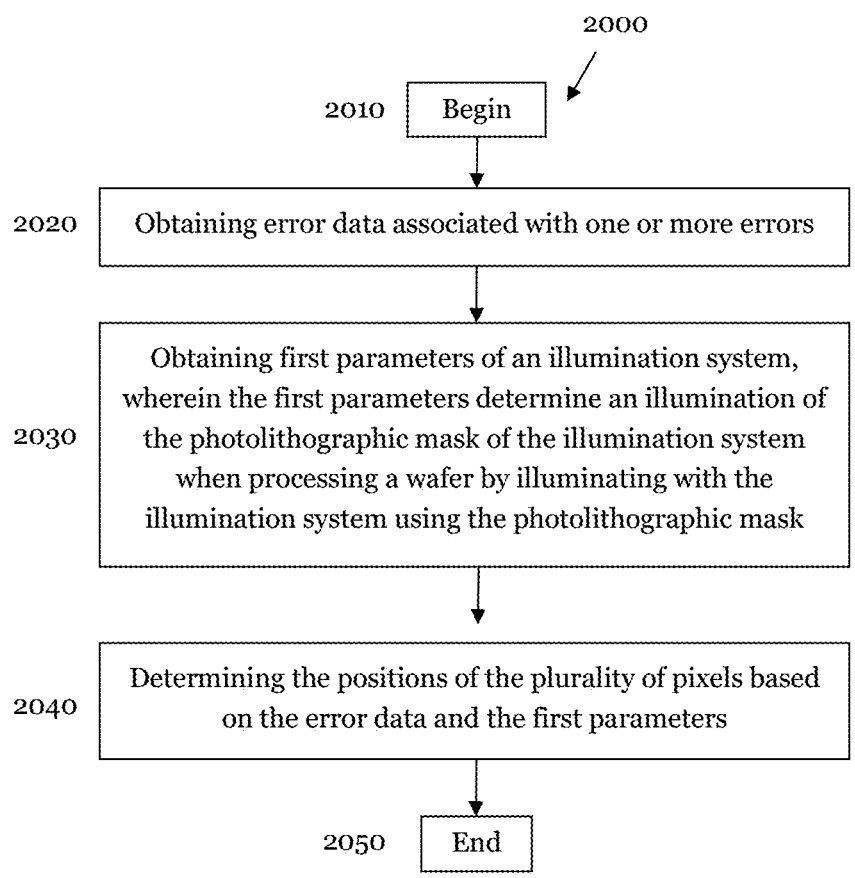
FIG. 20 shows a flow chart of the inventive method of the present application.

FIG. 20 presents a flow chart 2000 of the inventive method. The method begins at 2010. In a first step 2020 error data are obtained associated with one or more errors 140, 145 of a photolithographic mask 100, 600. The error data may be obtained from a metrology tool 320. In the next step 2030, first parameters of an illumination system 350 are obtained. The first parameters determine an illumination of the photolithographic mask 100, 600 by the illumination system 350 when a wafer 460 is processed by illuminating with the illumination system 350 using the photolithographic mask 100, 600. The first parameters may be obtained from the illumination system 350. Then at step 2040, the positions of the plurality of pixels are determined based on the error data and the first parameters. The method ends at step 2050.

In some implementations, the computer system 560 can include one or more data processors for processing data, one or more storage devices for storing data, such as one or more databases, and/or one or more computer programs including instructions that when executed by the computer system causes the computer system to carry out the computations or processes described above. The computer system can include one or more input devices, such as a keyboard, a mouse, a touchpad, and/or a voice command input module, and one or more output devices, such as a display, and/or an audio speaker.

The computer system can show graphical user interfaces on the display to assist the user of the error correction apparatus.

In some implementations, the computer system 560 can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer system 560 is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for operating an error correction apparatus described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A method for determining positions of a plurality of pixels to be introduced into a substrate of a photolithographic mask by use of a laser system, wherein the pixels serve to at least partly correct one or more errors of the photolithographic mask, the method comprising:
    a. obtaining error data associated with the one or more errors;
    b. obtaining first parameters of an illumination system, the first parameters determining an illumination of the photolithographic mask of the illumination system when processing a wafer by illuminating with the illumination system using the photolithographic mask, wherein obtaining the first parameters comprises deconvoluting an error correction map with a deconvolution kernel comprising an illumination pixel transmission; and
    c. determining the positions of the plurality of pixels based on the error data and the first parameters.

2. The method of claim 1, wherein the one or more errors comprise at least one of: at least one registration error of a pattern of the photolithographic mask, at least one optical transmission error of the substrate of the photolithographic mask, at least one planarity error of the substrate of the photolithographic mask, and at least one overlay error.

3. The method of claim 1, wherein step c. comprises determining the positions of the plurality of pixels based on the error data, the first parameters, and second parameters associated with a linear imaging transformation performed by the illumination system.

4. The method of claim 1, wherein the illumination system comprises at least one aperture determining the illumination of the photolithographic mask.

5. The method of claim 1, wherein obtaining the first parameters comprises: deconvoluting an error correction map with a deconvolution kernel comprising the illumination of the illumination system.

6. The method of claim 1, wherein determining the illumination pixel transmission comprises: deconvoluting the error correction map with the pixel density.

7. The method of claim 1, wherein determining the deconvolution kernel of the illumination comprises:
    a. generating a reference mask having a plurality of pixels arranged with a varying pixel density;
    b. illuminating several wafers with the reference mask using a monopole setting, wherein each wafer is illuminated with a different angle of the monopole setting relative to an optical axis of the reference mask; and
    c. determining the deconvolution kernel of the illumination from a variation of the critical dimension of the several illuminated wafers.

8. The method of claim 1, wherein determining the deconvolution kernel of the illumination comprises:
    a. illuminating a wafer by a photolithographic mask with an illumination of the illumination system, wherein the photolithographic mask does not have the plurality of pixels, and determining the critical dimension of the wafer;
    b. writing a pixel density into the substrate of the photolithographic mask;
    c. illuminating the wafer by the photolithographic mask with the illumination of the illumination system, and determining a critical dimension;
    d. determining a variation of the critical dimension by subtracting the critical dimension of step a. from the critical dimension of step c.; and
    e. determining the deconvolution kernel by deconvoluting the variation of the critical dimension with the written pixel density.

9. The method of claim 1, further comprising the step of determining a type of each of the plurality of pixels.

10. The method of claim 9, further comprising the step of determining laser beam parameters of the laser system based on the determined positions and the type of each of the plurality of pixels.

11. The method of claim 1, further comprising the step of generating a writing map based on the positions and the type of the determined pixels, wherein the writing map describes a distribution of the plurality of pixels to be introduced in the substrate of the photolithographic mask.

12. The method of claim 11, wherein the writing map compensates an averaging effect of an illumination of the photolithographic mask by the illumination system having the first parameters and/or second parameters associated with a linear imaging transformation performed by the illumination system on the plurality of pixels when processing the wafer.

13. The method of claim 12, further comprising the step of increasing a density of pixel arrangements in the writing map, and/or reducing a pixel density within the pixel arrangements in the writing map for compensating the averaging effect of the illumination of the illumination system.

14. A non-transitory computer-readable medium storing a computer program comprising instructions for causing a computer system to perform the steps of claim 1.

15. The method of claim 1, wherein the first parameters comprise at least one of: an on-axis illumination setting, an annular illumination setting, a dipole illumination setting, a quadrupole illumination setting, a disar illumination setting, a quasar illumination setting, or a source mask optimization, SMO, setting.

16. An apparatus for determining positions of a plurality of pixels to be introduced into a substrate of a photolithographic mask by use of a laser system, wherein the pixels serve to at least partly correct one or more errors of the photolithographic mask, wherein the apparatus comprises:
   a. means for obtaining error data associated with the one or more errors;
   b. means for obtaining first parameters of an illumination system, the first parameters determining an illumination of the photolithographic mask by the illumination system when processing a wafer by illuminating with the illumination system using the photolithographic mask, wherein obtaining the first parameters comprises deconvoluting an error correction map with a deconvolution kernel comprising an illumination pixel transmission; and
   c. means for determining the positions of the plurality of pixels based on the error data and the first parameters.

17. The apparatus of claim 16, wherein the means for obtaining error data comprises means for measuring the error data of the photolithographic mask.

18. The apparatus of claim 16, further comprising means for determining an optical transmission variation across the photolithographic mask.

19. The apparatus of claim 16, wherein the apparatus is adapted to execute the steps of:
   obtaining error data associated with the one or more errors;
   obtaining first parameters of an illumination system, the first parameters determining an illumination of the photolithographic mask of the illumination system when processing a wafer by illuminating with the illumination system using the photolithographic mask; and
   determining the positions of the plurality of pixels based on the error data and the first parameters.

20. The apparatus of claim 16, wherein the first parameters comprise at least one of: an on-axis illumination setting, an annular illumination setting, a dipole illumination setting, a quadrupole illumination setting, a disar illumination setting, a quasar illumination setting, or a source mask optimization, SMO, setting.

21. A method for determining positions of a plurality of pixels to be introduced into a substrate of a photolithographic mask by use of a laser system, wherein the pixels serve to at least partly correct one or more errors of the photolithographic mask, the method comprising:
   obtaining error data associated with the one or more errors;
   obtaining first parameters of an illumination system, the first parameters determining an illumination of the photolithographic mask of the illumination system when processing a wafer by illuminating with the illumination system using the photolithographic mask, wherein obtaining the first parameters comprises deconvoluting an error correction map with a deconvolution kernel comprising the illumination of the illumination system; and
   determining the positions of the plurality of pixels based on the error data and the first parameters.

22. A method for determining positions of a plurality of pixels to be introduced into a substrate of a photolithographic mask by use of a laser system, wherein the pixels serve to at least partly correct one or more errors of the photolithographic mask, the method comprising:
   obtaining error data associated with the one or more errors;
   obtaining first parameters of an illumination system, the first parameters determining an illumination of the photolithographic mask of the illumination system when processing a wafer by illuminating with the illumination system using the photolithographic mask; and
   determining the positions of the plurality of pixels based on the error data and the first parameters;
   generating a writing map based on the positions and the type of the determined pixels, wherein the writing map describes a distribution of the plurality of pixels to be introduced in the substrate of the photolithographic mask;
   wherein the writing map compensates an averaging effect of an illumination of the photolithographic mask by the illumination system having the first parameters and/or second parameters associated with a linear imaging transformation performed by the illumination system on the plurality of pixels when processing the wafer.

* * * * *

UNITED STATES PATENT AND TRADEMARK OFFICE
CERTIFICATE OF CORRECTION

| | | |
|---|---|---|
| PATENT NO. | : 11,366,383 B2 | Page 1 of 2 |
| APPLICATION NO. | : 16/589515 | |
| DATED | : June 21, 2022 | |
| INVENTOR(S) | : Vladimir Dmitriev et al. | |

It is certified that error appears in the above-identified patent and that said Letters Patent is hereby corrected as shown below:

In the Specification

Column 7

Line 50, delete "$PT\left(d \cdot tan\left(arcsin\frac{x_p}{n}\right), d \cdot tan\left(arcsin\frac{y_p}{n}\right)\right)$" and insert -- $PT'\left(d \cdot tan\left(arcsin\frac{x_p}{n}\right), d \cdot tan\left(arcsin\frac{y_p}{n}\right)\right)$ --.

Line 64 (Approx.), delete "T(x,y) =" and insert -- ΔT(x,y) = --.

Column 9
Line 22, delete "optical 1.5 transmission" and insert -- optical transmission --.

Line 58, delete "$PT(x_p, y_p) = PT\left(d \cdot tan\left(arcsin\frac{x_p}{n}\right), d \cdot tan\left(arcsin\frac{y_p}{n}\right)\right)$" and insert -- $PT'(x_p, y_p) = PT'\left(d \cdot tan\left(arcsin\frac{x_p}{n}\right), d \cdot tan\left(arcsin\frac{y_p}{n}\right)\right)$ --.

Columns 12 and 13
Lines 67 and 1, delete "photlithographic" and insert -- photolithographic --.

Column 14
Line 30, delete "three 1.5 dimensions" and insert -- three dimensions --.

Signed and Sealed this
First Day of November, 2022

*Katherine Kelly Vidal*

Katherine Kelly Vidal
*Director of the United States Patent and Trademark Office*

CERTIFICATE OF CORRECTION (continued)
U.S. Pat. No. 11,366,383 B2

Column 22

Lines 58-59, delete "$-\arcsin[NA_G / n_{Qz}]$" and insert --$= \arcsin[NA_G / n_{Qz}]$--.